United States Patent
Ruiz et al.

(10) Patent No.: US 10,290,804 B2
(45) Date of Patent: May 14, 2019

(54) NANOPARTICLE-BASED RESISTIVE MEMORY DEVICE AND METHODS FOR MANUFACTURING THE SAME

(71) Applicant: SANDISK TECHNOLOGIES LLC, Plano, TX (US)

(72) Inventors: Ricardo Ruiz, Santa Clara, CA (US); Jeffrey Lille, Sunnyvale, CA (US); Mac D. Apodaca, San Jose, CA (US); Derek Stewart, Livermore, CA (US); Lei Wan, San Jose, CA (US); Bruce Terris, Sunnyvale, CA (US)

(73) Assignee: SANDISK TECHNOLOGIES LLC, Addison, TX (US)

( * ) Notice: Subject to any disclaimer, the term of this patent is extended or adjusted under 35 U.S.C. 154(b) by 29 days.

(21) Appl. No.: 15/637,357

(22) Filed: Jun. 29, 2017

(65) Prior Publication Data

US 2018/0212147 A1    Jul. 26, 2018

Related U.S. Application Data

(60) Provisional application No. 62/449,351, filed on Jan. 23, 2017.

(51) Int. Cl.
| | |
|---|---|
| *H01L 21/00* | (2006.01) |
| *H01L 45/00* | (2006.01) |
| *H01L 27/24* | (2006.01) |
| *H01L 21/02* | (2006.01) |

(52) U.S. Cl.
CPC ........ *H01L 45/1641* (2013.01); *H01L 27/249* (2013.01); *H01L 45/06* (2013.01); *H01L 45/08* (2013.01); *H01L 45/1233* (2013.01); *H01L 45/1253* (2013.01); *H01L 45/14* (2013.01); *H01L 45/144* (2013.01); *H01L 45/146* (2013.01); *H01L 45/147* (2013.01); *H01L 45/1608* (2013.01); *H01L 21/02601* (2013.01); *H01L 45/149* (2013.01)

(58) Field of Classification Search
CPC ............ H01L 21/02601; H01L 45/149; Y10S 977/783; Y10S 977/786; Y10S 977/787
See application file for complete search history.

(56) References Cited

U.S. PATENT DOCUMENTS

| | | | |
|---|---|---|---|
| 8,926,851 B2 | 1/2015 | Lille et al. | |
| 9,691,520 B2* | 6/2017 | Kim | ........................ B01J 13/02 |
| 9,741,765 B1* | 8/2017 | Narayanan | .......... H01L 45/1233 |
| 9,793,474 B2* | 10/2017 | Sun | ....................... H01L 45/148 |

(Continued)

OTHER PUBLICATIONS

International Search Report and Written Opinion from the International Searching Authority for International Patent Application No. PCT/US2017/062011, dated May 7, 2018, 17 pages.

(Continued)

*Primary Examiner* — Nicholas J Tobergte
(74) *Attorney, Agent, or Firm* — The Marbury Law Group, PLLC

(57) ABSTRACT

Resistive memory cells containing nanoparticles are formed between two electrodes. The nanoparticles may be embedded in a matrix or sintered together without a matrix. The memory cells may be projected memory cells or barrier modulated cells. Polymeric ligands may be used to deposit the nanoparticles over a substrate, followed by an optional removal or replacement of the polymeric ligands.

25 Claims, 20 Drawing Sheets

(56) References Cited

U.S. PATENT DOCUMENTS

| | | | |
|---|---|---|---|
| 10,138,331 B2* | 11/2018 | Li | C08G 79/02 |
| 2014/0138352 A1 | 5/2014 | Lille et al. | |
| 2014/0197369 A1* | 7/2014 | Sheng | H01L 45/1608 257/4 |
| 2014/0213032 A1 | 7/2014 | Kai et al. | |
| 2015/0073101 A1* | 3/2015 | Kim | B01J 13/02 525/436 |
| 2016/0140991 A1 | 5/2016 | Chen et al. | |
| 2016/0140994 A1 | 5/2016 | Chen et al. | |

OTHER PUBLICATIONS

Wong, H.S. P., et al., "Phase Change Memory," Proceedings of the IEEE, vol. 98, No. 12, pp. 2201-2227, (2010).

Raoux, S. et al., "Phase-Change Random Access Memory: A Scalable Technology," IBM J. Res. & Dev., vol. 52, No. 4/5, pp. 465-479, (2008).

Koelmans, W. W. et al., "Projected Phase-Change Memory Devices," Nature Communications, pp. 1-7, (2015).

Caldwell, M. A. et al., "Nanoscale Phase Change Memory Materials," Nanoscale, vol. 4, pp. 4382-4392, (2012).

Caldwell, M. A. et al., "Colloidal Nanoparticles for Phase Change Memory Applications," A Dissertation Submitted to the Department of Chemistry and the Committee on Graduate Studies of Stanford University in Partial Fulfillment of the Requirements for the Degree of Doctor of Philosophy, 113 pages, (2011).

Waser, R., "Redox-Based Resistive Switching Memories Nanoionic Mechanisms, Prospects, and Challenges," ResearchGate, Advanced Materials, vol. 21, pp. 2632-2663, (2009).

Prakash, A. et al., "$TaO_x$-Based Resistive Switching Memories: Prospective and Challenges," Nanoscale Research Letters, vol. 8, pp. 1-17, (2013).

Pan, F. et al., "Nonvolatile Resistive Switching Memories-Characteristics, Mechanisms and Challenges," Progress in Natural Science: Materials International, vol. 20, pp. 1-15, (2010).

Govoreanu, B. et al., "a-VMCO: A Novel Forming-Free, Self-Reciting, Analog Memory Cell with Low-Current Operation, Nonfilamentary Switching and Excellent Variability," 2015 Symposium on VLSI Technology Digest of Technical Papers, pp. T132-T133, (2015).

Govoreanu, B. et al., "Vacancy-Modulated Conductive Oxide Resistive RAM (VMCO-RRAM): An Area-Scalable Switching Current, Self-Compliant, Highly Nonlinear and Wide On/Off-Window Resistive Switching Cell," IEDM 13-256 to IEDM 13-259, 10.2.1 to 10.2.4, (2013).

Subhechha, S. et al., Extensive Reliability Investigation of a-VMCO Nonfilamentary RRAM: Relaxation, Retention and Key Differences to Filamentary Switching, IEEE, pp. 6C-2-1 to 6C-2-5, (2016).

Bousoulas, P. et al., Low-Power and Highly Uniform 3-b Multilevel Switching in Forming Free TiO2-x-Based RRAM With Embedded Pt Nanocrystals, IEEE Electron Device Letters, vol. 37, No. 7, pp. 874-877, (2016).

Wang, L.G. et al., "Atomic Layer Deposited Oxide-Based Nanocomposite Structures with Embedded CoPtx Nanocrystals for Resistive Random Access Memory Applications," ACS Applied Materials & Interfaces, Research Article, vol. 9, pp. 6634-6643, (2017).

Wang, Y. et al., Improving the electrical performance of resistive switching memory using doping technology, Chinese Science Bulletin, Optoelectronics, vol. 57, No. 11, pp. 1235-1240, (2012).

Gongiu, M. et al., "Printable ReRAM devices based on the nonstoichiometric junction CuS/Cu2—xS," Electronics Letters Oct. 27, 2016, vol. 52, No. 22 pp. 1871-1873, (2016).

Cheng, C. H. et al., "Long-Endurance Nanocrystal TiO2 Resistive Memory Using a TaON Buffer Layer," IEEE Electron Device Letters, vol. 32, No. 12, pp. 1749-1751, (2011).

Ephraim, J. et al., "Transparent Conductive Oxide Nanocrystals Coated with Insulators by Atomic Layer Deposition," Chemistry of Materials, vol. 28, pp. 5549-5553, (2016).

Farhadi, A. et al., "On the assessment of photocatalytic activity and charge carrier mechanism of TiO2@SnO2 core-shell nanoparticles for water decontamination," Journal of Photochemistry and Photobiology A: Chemistry, vol. 338, pp. 171-177, (2017).

Pan, J. et al., "SnO2_TiO2 Core_Shell Nanowire Structures: Investigations on Solid State Reactivity and Photocatalytic Behavior," The Journal of Physical Chemistry, vol. 115, pp. 17265-17269, (2011).

Xiong, Z. et al., "Nitrogen-Doped Titanate-Anatase Core-Shell Nanobelts with Exposed {101} Anatase Facets and Enhanced Visible Light Photocatalytic Activity," Journal of the American Chemical Society, vol. 134, pp. 5754-5757, (2012).

Shevchenko, E.V. et al., "Structural diversity in binary nanoparticle Superlattices," Nature Letters, vol. 439, pp. 55-59, (2006).

Talapin, D. V., "Nanocrystal Solids: A Modular Approach to Materials Design," Materials Research Society, vol. 37, pp. 63-71, (2012).

Anders, A. et al., "X-ray studies of magnetic nanoparticle assemblies," Journal of Applied Physics, vol. 93, pp. 7343-7345, (2003).

Dong, A. et al., "Two-Dimensional Binary and Ternary Nanocrystal Superlattices: The Case of Monolayers and Bilayers," Nano Lett. 2011, vol. 11, pp. 1804-1809, (2011).

Dong, A. et al., "Binary nanocrystal superlattice membranes self-assembled at the liquid-air interface," Nature Letters, vol. 466, pp. 474-477, (2010).

Che, J. et al., "Preparation of Ordered Monolayers of Polymer Grafted Nanoparticles: Impact of Architecture, Concentration, and Substrate Surface Energy," Macromolecules 2016, vol. 49, 1834-1847, (2016).

Murray, C. B. et al., "Synthesis and Characterization of Monodisperse Nanocrystals and Close-Packed Nanocrystal Assemblies," Annu. Rev. Mater. Sci. 2000. vol. 30, pp. 545-610, (2000).

Kovalenko, M. V. et al., "Prospects of Nanoscience with Nanocrystals," ACS Nano, vol. 9, No. 2, pp. 1012-1057, (2015).

Asbahi, M. et al., "Directed Self-Assembly of Densely Packed Gold Nanoparticles," Langmuir 2012, vol. 28, pp. 16782-16787, (2012).

Hanrath, T. et al., "Structure/Processing Relationships of Highly Ordered Lead Salt Nanocrystal Superlattices," ACS Nano, vol. 3, No. 10, pp. 2975-2988 (2009).

Bian, K. et al., "Shape-Anisotropy Driven Symmetry Transformations in Nanocrystal Superlattice Polymorphs," ACS Nano, vol. 5, No. pp. 2815-2823, (2011).

Goodfellow, B. W. et al., "Reversible Solvent Vapor-Mediated Phase Changes in Nanocrystal Superlattice," ACS Nano, vol. 5, No. 4, pp. 249-2424, (2011).

Ehlert, S. et al., "Polymer Ligand Exchange to Control Stabilization and Compatibilization of Nanocrystals," vol. 8, No. 6, pp. 6114-6122, (2014).

Fischer, S. et al., "Completely Miscible Nanocomposites," Angewandte Chemie, Supporting Information @ Wiley-VCH 2011, Weinheim, Germany, 11 pages, (2011).

Nag, A. et al., "Metal-free Inorganic Ligands for Colloidal Nanocrystals: $S^{2-}$, $HS^-$, $Se^{2-}$, $HSe^-$, $Te^{2-}$, $HTe^-$, $TeS_3^{2-}$, $OH^-$, and $NH_2^-$ as Surface Ligands," J. Am. Chem. Soc. 2011, vol. 133, pp. 10612-10620, (2011).

Zhang, J. et al., "Reversible Kirkwood-Alder Transition Observed in Pt3Cu2 Nanoctahedron Assemblies under Controlled Solvent Annealing/Drying Conditions," J. Am. Chem. Soc. 2012, vol. 134, pp. 14043-14049, (2012).

Mehdizadeh, S. et al., "Routes to Nanoparticle-Polymer Superlattices," Polymers 2011, vol. 3, pp. 662-673, (2011).

De Trizio, L. et al., "Forging Colloidal Nanostructures via Cation Exchange Reactions," Chem. Rev. 2016, vol. 116, pp. 10852-10887, (2016).

Gaulding, E. A. et al., "Deposition of Wafer-Scale Single-Component and Binary Nanocrystal Superlattice Thin Films via Dip-Coating," Adv. Mater. 2015, vol. 27, pp. 2846-2851, (2015).

Kar, A. et al., "Recent development of core-shell SnO2 nanostructures and their potential applications," J. Mater. Chem. C, 2014, vol. 2, pp. 6706-6722, (2014).

(56) References Cited

OTHER PUBLICATIONS

Invitation to Pay Additional Fees and, Where Applicable, Protest Fee from the International Searching Authority for International Patent Application No. PCT/US2017/062011, dated Mar. 8, 2018, 12 pages.

* cited by examiner

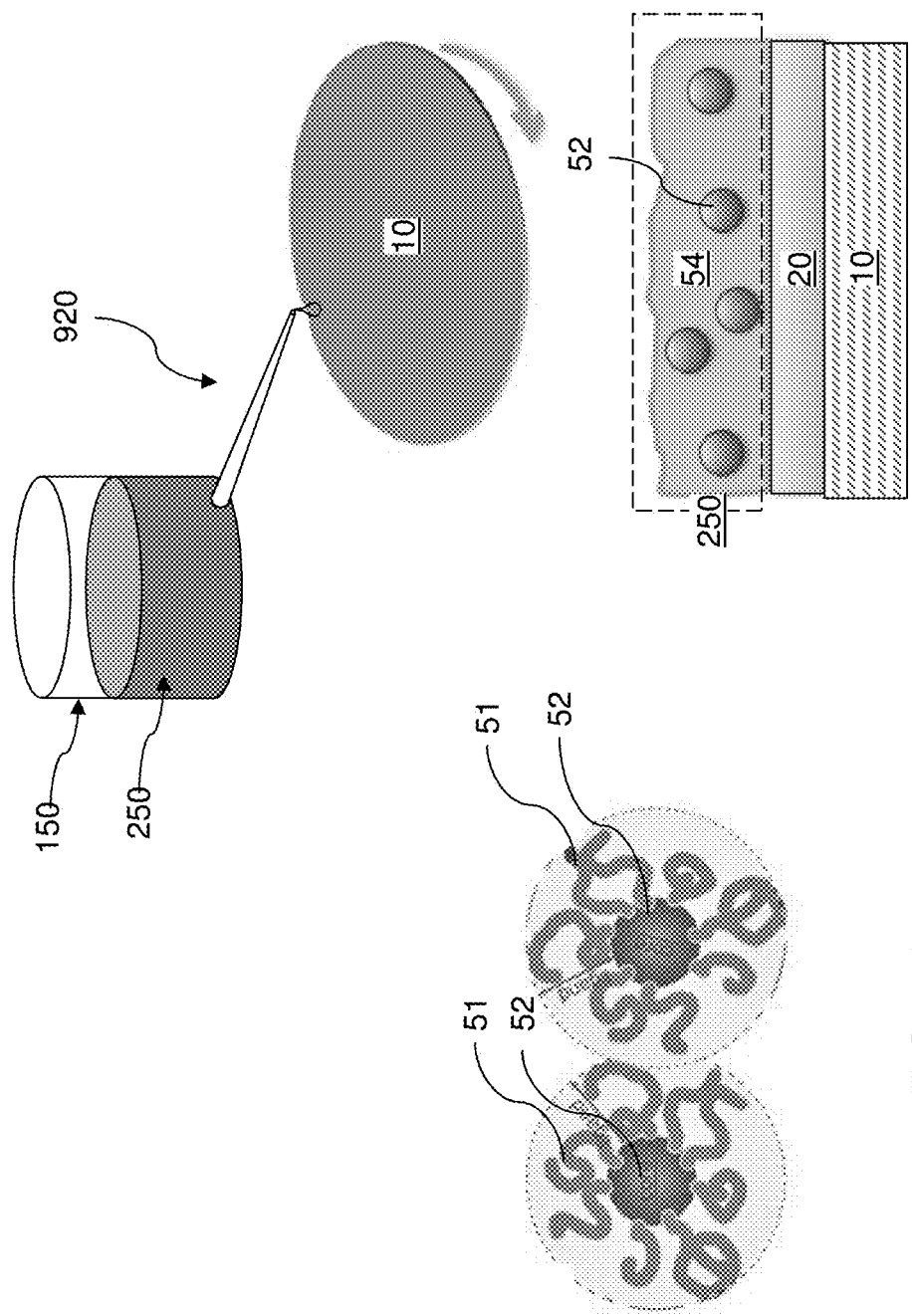

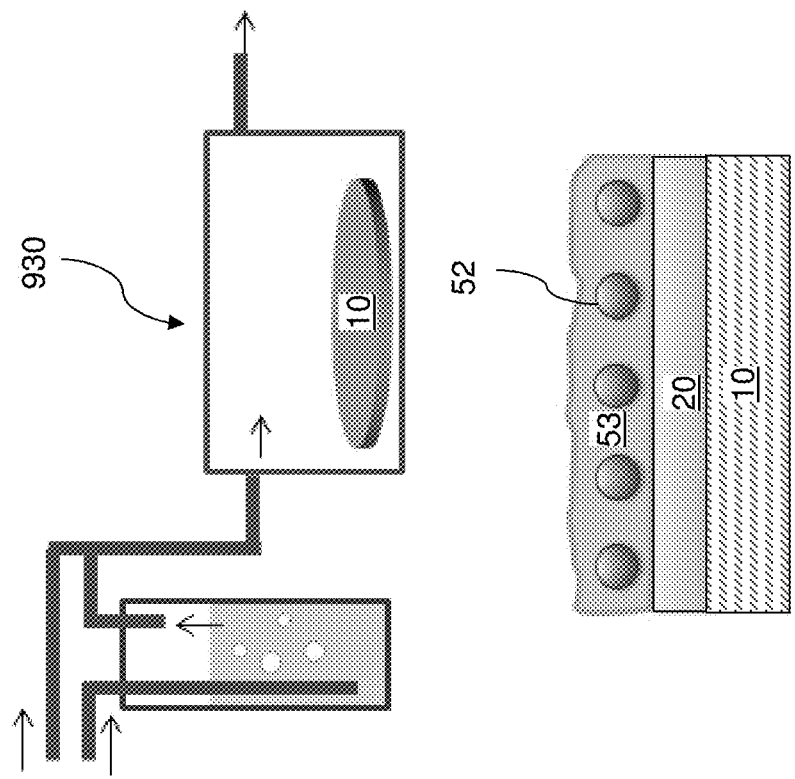
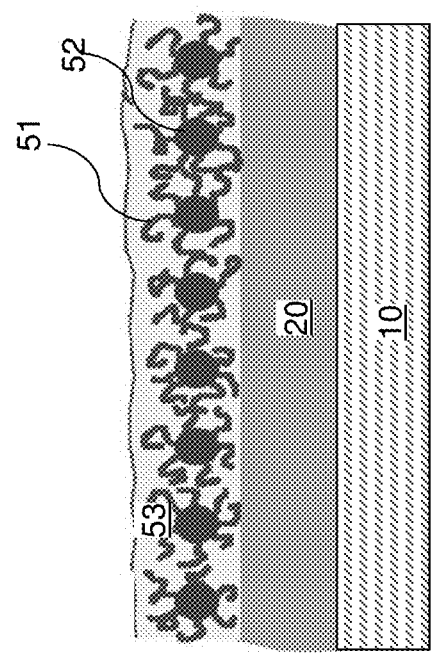
FIG. 1C
FIG. 1D

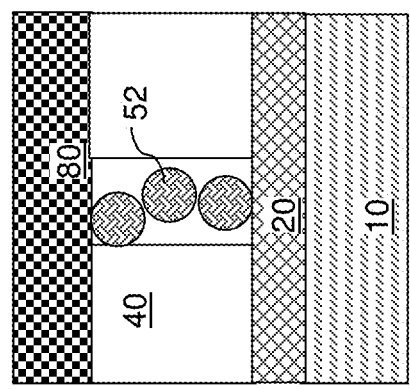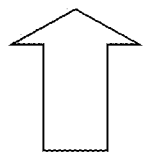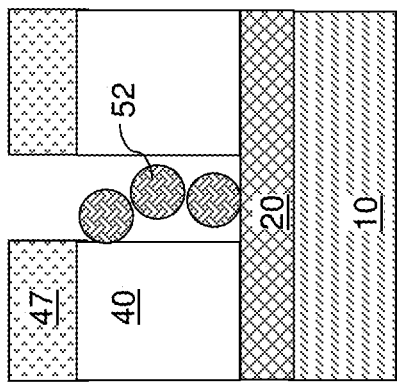
FIG. 5C

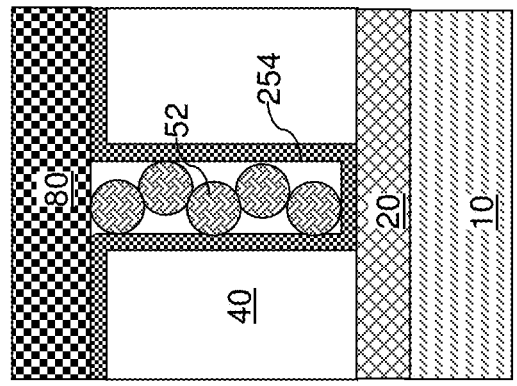
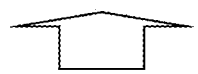
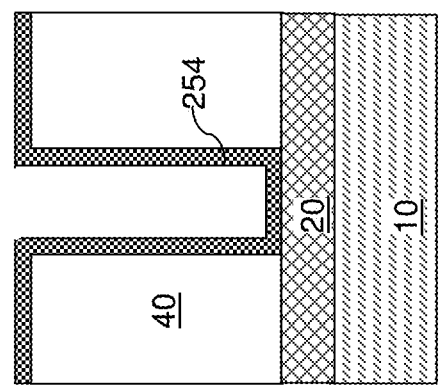
FIG. 7A

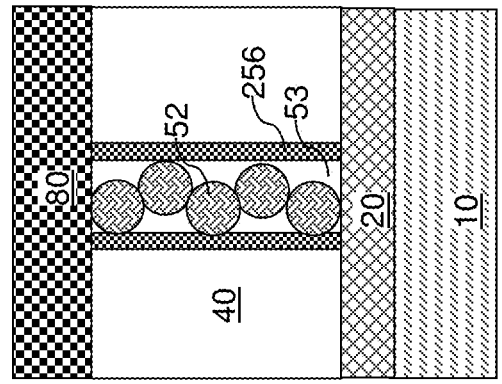
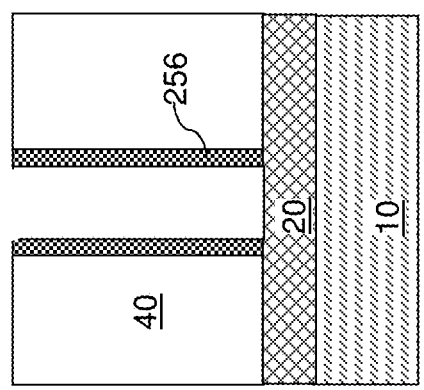
FIG. 7B

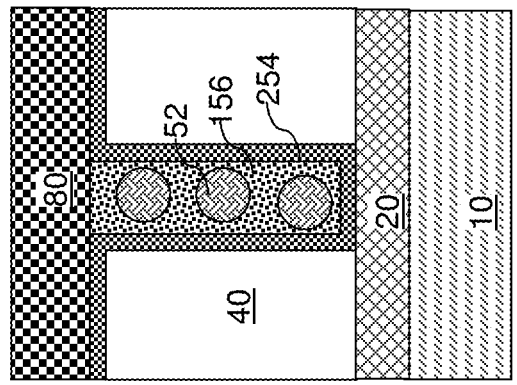
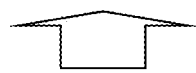
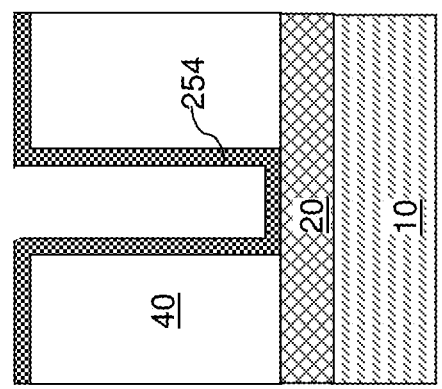
FIG. 8A

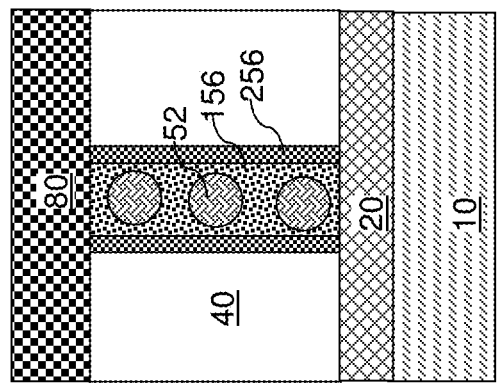
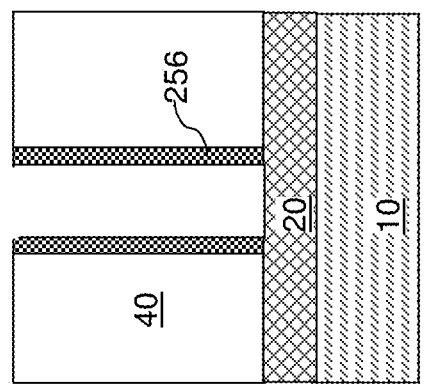
FIG. 8B

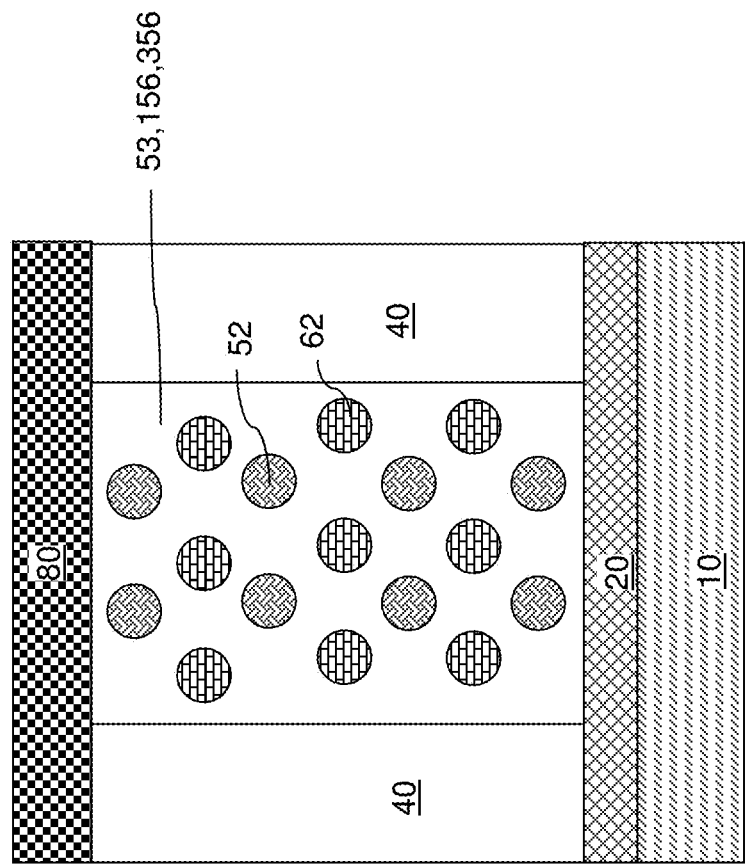
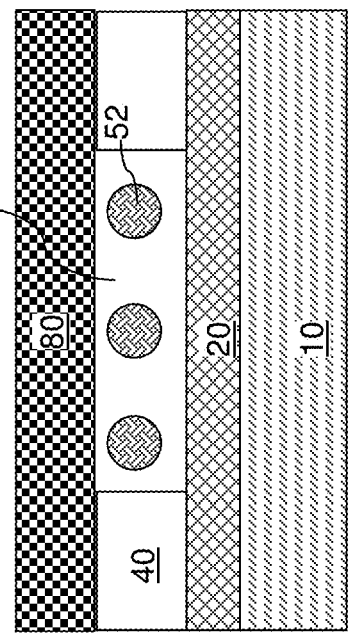
FIG. 10B
FIG. 10A

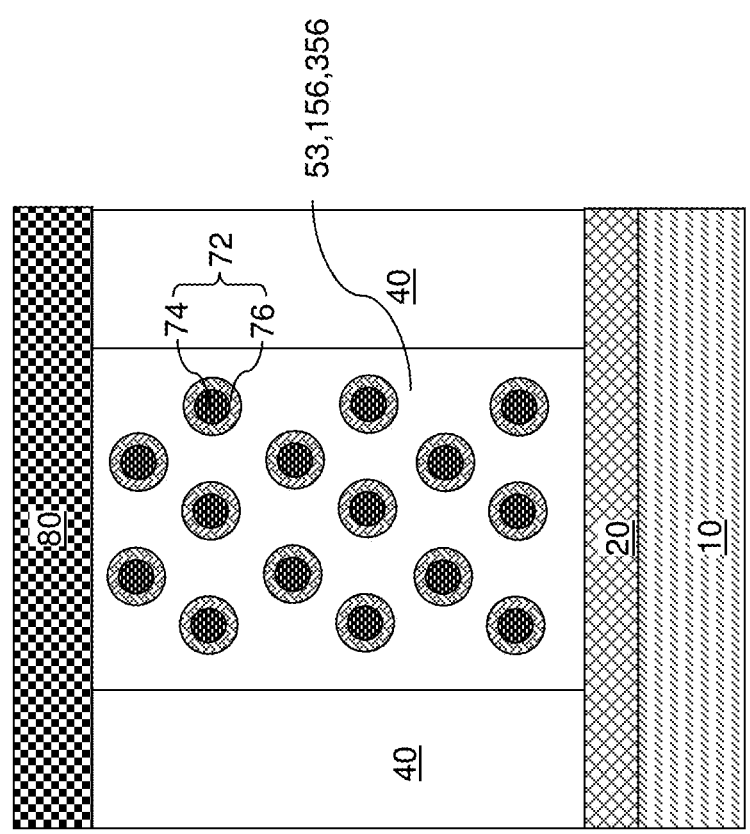

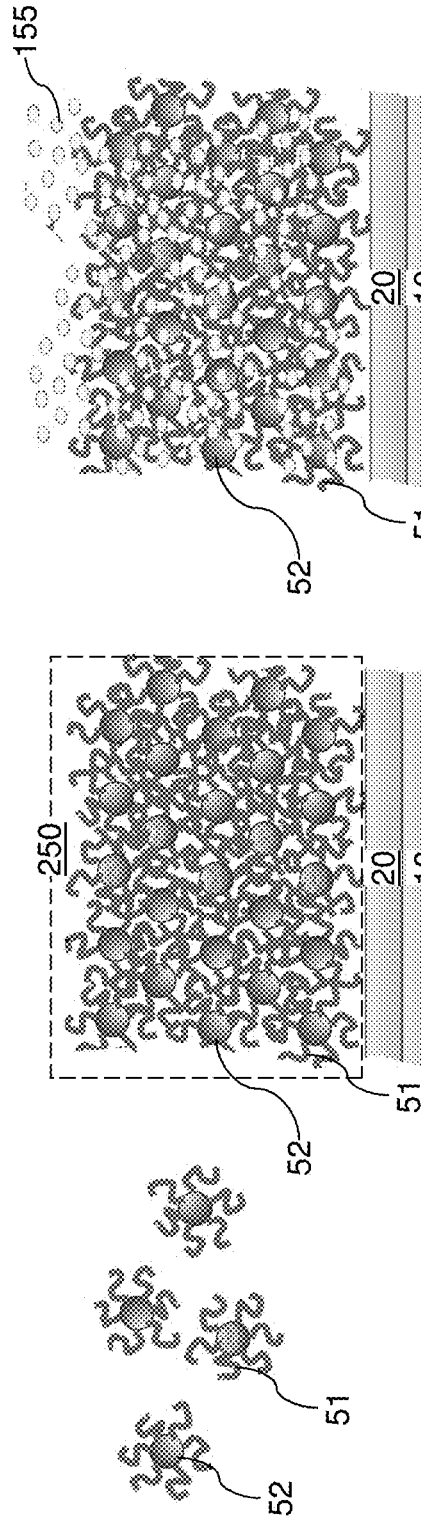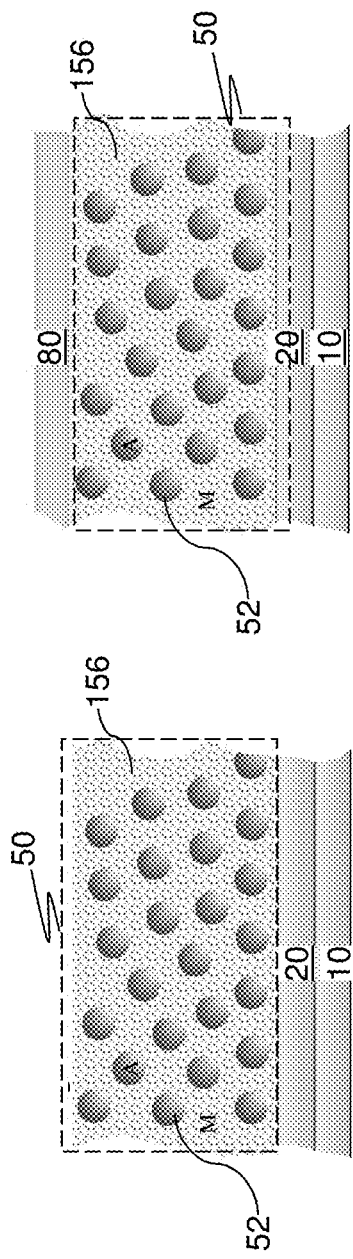
FIG. 14A
FIG. 14B
FIG. 14C
FIG. 14D
FIG. 14E

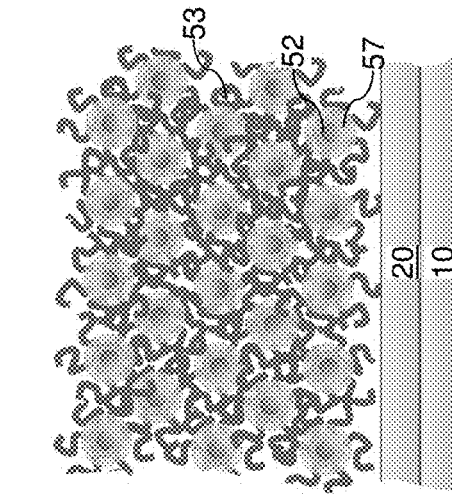
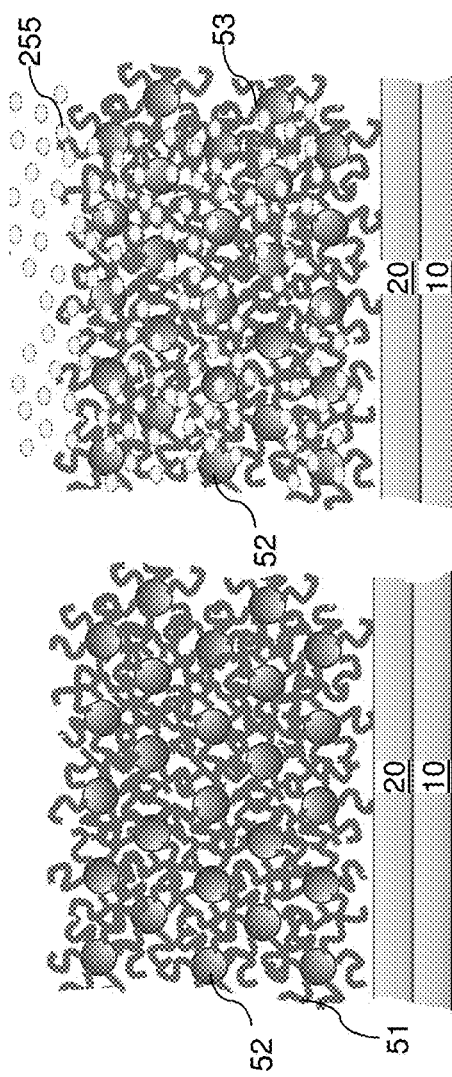
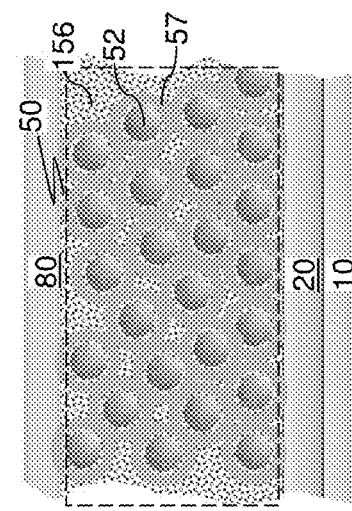
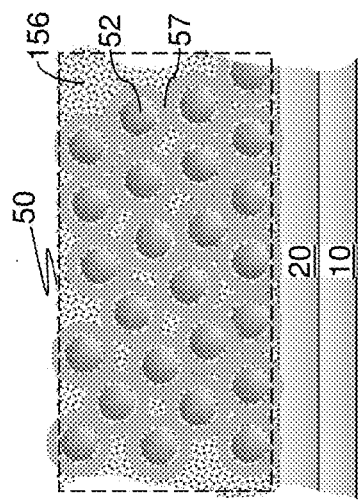
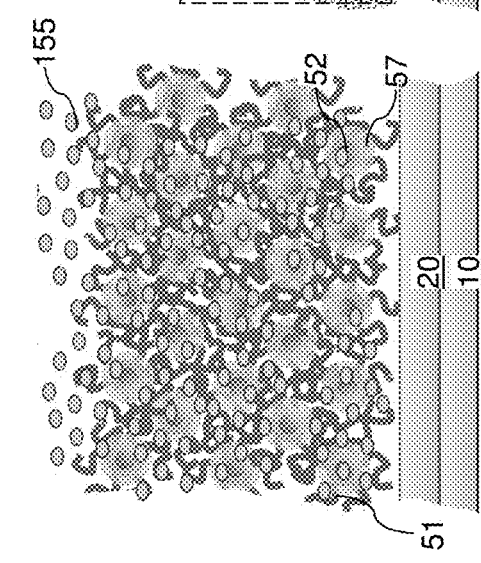
FIG. 15A  FIG. 15B  FIG. 15C  FIG. 15D  FIG. 15E  FIG. 15F

US 10,290,804 B2

NANOPARTICLE-BASED RESISTIVE MEMORY DEVICE AND METHODS FOR MANUFACTURING THE SAME

FIELD

The present disclosure relates generally to the field of semiconductor devices and specifically to resistive memory devices employing nanoparticles, and methods of manufacturing the same.

BACKGROUND

Resistive random access memory (ReRAM) devices refer to non-volatile memory (NVM) devices that employ multiple resistive states of a material. ReRAM devices have the potential to provide high memory density at low cost with fast read/write access time and high endurance.

SUMMARY

According to one embodiment of the present disclosure, a method of fabricating a memory cell comprises forming a first electrode, providing polymer-grafted memory material nanoparticles which form a polymer matrix made of polymeric ligand that embeds the memory material nanoparticles, and forming a second electrode.

According to another embodiment of the present disclosure, a barrier modulated memory cell, comprises a first electrode, a variable resistance region comprising metal oxide nanoparticles and a barrier material in contact with the metal oxide nanoparticles, and a second electrode.

According to another embodiment of the present disclosure, a projected memory cell comprises a first electrode, a second electrode, and a variable resistance region located between the first and the second electrodes. The variable resistance region comprises chalcogenide phase change memory material nanoparticles and a projection material liner that connects the first electrode to the second electrode. The projection material liner has a resistivity which is between low and high resistance states of the chalcogenide phase change memory material.

BRIEF DESCRIPTION OF THE DRAWINGS

FIG. 1A illustrates a polymer-grafted nanoparticles. Polymeric chains (ligands) are grafted to nanoparticle cores according to a first embodiment of the present disclosure.

FIG. 1B illustrates polymer grafted nanoparticles that are deposited onto a substrate by spin coating. Individual polymeric chains are not shown for clarity, and are represented by a uniform matrix formed by the polymer chains according to the first embodiment of the present disclosure.

FIG. 1C illustrates dried polymer grafted nanoparticles, which form a dense array with the ligands interpenetrating and forming a uniform matrix. The ligands keep the particles at a uniform distance and form an embedding polymer matrix according to the first embodiment of the present disclosure.

FIG. 1D illustrates a solvent annealing step, which is used to facilitate self-assembly and rearrange the nanoparticles according to the first embodiment of the present disclosure.

FIGS. 5A, 5B, and 5C illustrate a manufacturing process for first, second, and third configurations of a second exemplary resistive memory cell in which the ligands are removed prior to formation of a second electrode according to a second embodiment of the present disclosure.

FIGS. 7A and 7B illustrate fourth exemplary memory cells having a "projection material" along the walls of the cell according to a fourth embodiment of the present disclosure. Nanoparticles may be deposited and treated in the same manner as in the first or second embodiments.

FIGS. 8A and 8B illustrate fifth exemplary memory cells having a "projection material" along the walls of the cell according to a fifth embodiment of the present disclosure. Nanoparticles may be deposited and the cell is filled with ALD infiltration synthesis according to the third embodiment.

FIGS. 10A and 10B illustrate seventh exemplary memory cells of the barrier memory cell type according to a seventh embodiment of the present disclosure.

FIG. 11 illustrates a seventh exemplary memory cell including nanoparticle cores each having an inner core and an outer shell according to an eighth embodiment of the present disclosure.

FIGS. 14A-14E illustrates a sequence of processing steps that can be employed to form any of the third through twelfth exemplary structures of the present disclosure.

FIGS. 15A-15F illustrates another sequence of processing steps that can be employed to form any of the third through twelfth exemplary structures of the present disclosure.

DETAILED DESCRIPTION

Figure 2A:
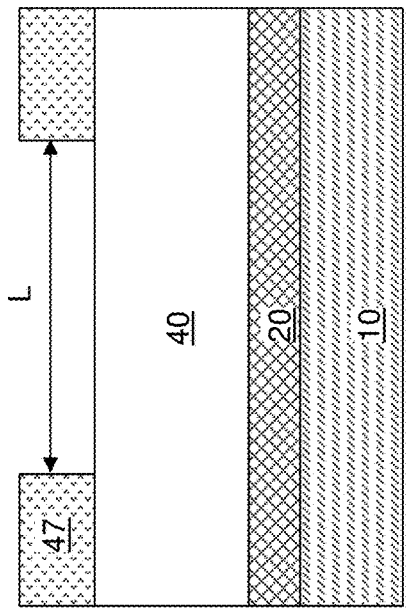
FIGS. 2A, 2B, and 2C schematically illustrate a process flow for fabrication of a first exemplary resistive memory cell including an opening through an insulating layer over a first electrode according to the first embodiment of the present disclosure.

As discussed above, the present disclosure is directed to resistive memory devices employing nanoparticles, and methods of manufacturing the same, the various aspects of which are described below. The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure. As used herein, a first element located "on" a second element can be located on the exterior side of a surface of the second element or on the interior side of the second element. As used herein, a first element is located "directly on" a second element if there exist a physical contact between a surface of the first element and a surface of the second element. As used herein, an "in-process" structure or a "transient" structure refers to a structure that is subsequently modified.

As used herein, a "nanoparticle" is a particle having a maximum dimension (such as a diameter) less than 100 microns, such as less than 1 micron, for example 1 to 900 nm, such as 2 to 500 nm, including 5 to 100 nm. A plurality of nanoparticles comprises particles with an average maximum dimension in the above range(s). Nanoparticles may be single crystalline (i.e., nanocrystals), polycrystalline or amorphous.

As used herein, a "polymer" refers to a compound or mixture of compounds formed by polymerization and comprising (e.g., consisting essentially) of repeating structural units. For example, in one embodiment, a polymer can be a substance consisting of molecules characterized by the sequence of one or more types of monomer units and comprising a simple weight majority of molecules containing at least three monomer units which are covalently bound to at least one other monomer unit or other reactant and consists of less than a simple weight majority of molecules of the same molecular weight. The degree of polymerization, i.e., the number of monomer units in the polymer, may be in a range from 1,000 to 100,000, although lesser and greater numbers can also be employed. A monomer unit is the reacted form of a monomer in a polymer.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, and/or may have one or more layer thereupon, thereabove, and/or therebelow.

As used herein, a "semiconducting material" refers to a material having electrical conductivity in the range from $1.0 \times 10^{-6}$ S/cm to $1.0 \times 10^{5}$ S/cm. As used herein, a "semiconductor material" refers to a material having electrical conductivity in the range from $1.0 \times 10^{-6}$ S/cm to $1.0 \times 10^{5}$ S/cm in the absence of electrical dopants therein, and is capable of producing a doped material having electrical conductivity in a range from 1.0 S/cm to $1.0 \times 10^{5}$ S/cm upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0 \times 10^{5}$ S/cm. As used herein, an "insulating material", "insulator material" or a "dielectric material" refers to a material having electrical conductivity less than $1.0 \times 10^{-6}$ S/cm. As used herein, a "heavily doped semiconductor material" refers to a semiconductor material that is doped with electrical dopant at a sufficiently high atomic concentration to become a conductive material, i.e., to have electrical conductivity greater than $1.0 \times 10^{5}$ S/cm. A "doped semiconductor material" may be a heavily doped semiconductor material, or may be a semiconductor material that includes electrical dopants (i.e., p-type dopants and/or n-type dopants) at a concentration that provides electrical conductivity in the range from $1.0 \times 10^{-6}$ S/cm to $1.0 \times 10^{5}$ S/cm. An "intrinsic semiconductor material" refers to a semiconductor material that is not doped with electrical dopants. Thus, a semiconductor material may be semiconducting or conductive, and may be an intrinsic semiconductor material or a doped semiconductor material. A doped semiconductor material can be semiconducting or conductive depending on the atomic concentration of electrical dopants therein. As used herein, a "metallic material" refers to a conductive material including at least one metallic element therein. All measurements for electrical conductivities are made at the standard condition.

As used herein, a "resistive memory material" or a "reversibly resistance-switching material" is a material of which the resistivity can be altered by application of a voltage across the material. As used herein, a "resistive memory material layer" refers to a layer including a resistive memory material. As used herein, a "resistive memory material nanoparticle" refers to a nanoparticle including a resistive memory material. As used herein, a "resistive memory element" refers to an element that includes a portion of a resistive memory material in a configuration that enables programming of the resistive memory material into at least two states having different values of electrical resistance.

According to an aspect of the present disclosure, a structure employing nanoparticles including a resistive memory material is provided, which can be employed to provide a design in the area of the device on a surface of a substrate does not limit the amount of active interface for memory switching. By embedding nanoparticles inside the memory cell, the amount of active interface is dictated by the amount of surface area of the nanoparticles in contact with the embedding medium, or the amount of nanoparticles between two electrodes. The total amount of active interface may be tuned by the size and the density of the nanoparticles, and not limited by the cell area (the footprint) on the substrate. Further, blends or superlattices of two or more types of nanoparticles can be embedded in a memory cell. This feature provides flexibility in interface engineering and a potential path for multilevel and/or neuromorphic memory cells.

The present disclosure provides a nanoparticle-based resistive memory device that can be employed to facilitate control and reproducibility of the switching volume and stability of the resistance levels. Various embodiments of nanoparticle-based resistive memory cells are provided. The nanoparticles of the present disclosure can be ligand-grafted conductive metal oxide nanoparticles, or ligand-grafted chalcogenide nanoparticles.

The switching volume for a phase change memory material or the active interface for a barrier modulated memory material is limited and controlled by the size of the nanoparticles, and is not significantly affected by the programming voltage. Ligand-grafted nanoparticles of the present disclosure offer a path to nanocomposite memory cells where the properties of the matrix material can be tuned for better reliability and performance.

In some embodiments, the organic ligands comprise polymer ligands or monomer ligands which are subsequently polymerized to form polymer ligands, In some embodiments, polymer coated resistive memory nanoparticles may provide one or more of the following advantages: (a) uniform coating over a wafer scale using standard spin coating (which is not believed to be not possible with alkyl chain ligands as known in the art); (b) uniformly filling small, deep cavities in the range of 10 nm-100 nm; (c) composite memory cell in which the space between particles is filled by ALD infiltration synthesis and choice of a material for tuning resistivity; (d) control of the switching volume by selection of the nanoparticle size and tuning of the resistivity by selection of the filling material; and (e) a design for a multilevel memory cell.

According to a first embodiment of the present disclosure, a uniform and conformal coating or filling can be achieved by using polymer coated nanoparticles. Additional space filling or an additional material is not required in the first embodiment.

Referring to FIG. 1A, ligand-grafted nanoparticles (51, 53) according to embodiments of the present disclosure are shown. Each of the ligand-grafted nanoparticles (51, 53) includes a nanoparticle core (i.e., nanoparticle) 52 and ligands 51 that are grafted to the nanoparticle core 52. The nanoparticle core 52 includes a resistive memory material. Each ligand-grafted nanoparticle including a nanoparticle core 52 and attached ligands 51 is a nanoparticle having a maximum dimension (such as a diameter) less than 1 micron, less than 300 nm, less than 100 nm, and/or less than 30 nm, and greater than 1 nm. In one embodiment, each of the ligand-grafted nanoparticles (51, 52) can comprise a nanoparticle core 52 that comprises a first material selected from a conductive metal oxide, a semiconducting metal oxide, and a chalcogenide material, and further comprises ligands 51 that are grafted to the nanoparticle core 52.

In one embodiment, the nanoparticles 52 can include ay chalcogenide resistive memory material known in the art. In one embodiment, the nanoparticles (e.g., nanoparticle cores) 52 include chalcogenide nanoparticles such as GeTe, GeSbTe, AgInSbTe, etc., preferably with diameters in the range of 2 nm-100 nm.

The nanoparticles can be capped with polymeric ligands, such as polystyrene (PS), polyvinyl 2 vinylpyridine (P2VP), polyvinyl 4 vinylpyridine (P4VP), polydimethylsiloxane (PDMS), polymethyl methacrylate (PMMA), etc. The polymeric ligands may have molecular weights in the range of 0.5 kg/mol to 50 kg/mol. The nanoparticles are dispersed in a suitable solvent for the polymeric ligand (e.g., toluene, methyl isobutyl ketone (MIBK), methyl ethyl ketone (MEK), acetone, dimethylformamide (DMF), chlorobenzene, etc). Polymeric chains (ligands) are grafted to nanoparticle cores at the processing step of FIG. 1A to form a polymer-grafted nanoparticle.

In another embodiment, the nanoparticles 52 can include a metal oxide material that provides at least two resistive states having different resistivity. The nanoparticles 52 may be semiconducting or conductive in each of the at least two resistive states. In other words, the nanoparticles 52 can have a conductivity in a range from $1.0 \times 10^{-6}$ S/cm to $1.0 \times 10^{10}$ S/cm in each of the at least two resistive states.

In one embodiment, the nanoparticles 52 comprise a metal oxide material selected from titanium oxide, hafnium oxide, zinc oxide, vanadium oxide, niobium oxide, tantalum oxide, strontium titanate and tin oxide for use in a barrier modulated cell (BMC). Examples of metal oxide materials include a slightly sub-stoichiometric metal oxide such as $TiO_{2-\delta}$, $SrTiO_{3-\delta}$, $NbO_{2-\delta}$, or $Nb:SrTiO_{3-\delta}$ where value of $\delta$ can be independently selected from a range from 0 to 0.5, such as greater than zero to 0.15 (i.e., to form a sub-stoichiometric, oxygen deficient metal oxide). For example, the metal oxide material may be titanium oxide, such as sub-stoichiometric titanium oxide having less than two oxygen atoms for each titanium atom. In one embodiment, the metal oxide may have a high concentration of free electrons in thermodynamic equilibrium in a range from $1.0 \times 10^{20}/cm^3$ to $1.0 \times 10^{21}/cm^3$.

A barrier modulated cell is a non-filamentary memory cell (i.e., where no conductive filaments are formed) in which an energy barrier is formed at the interface between the nanoparticles 52 and an adjacent material. The energy width and energy height of the barrier may be modulated by the diffusion of oxygen vacancies and/or interstitial oxygen ions in and out of the interface. The modulation of the energy band structure at the interface can provide a change to the overall resistivity of the variable resistance region. The vacancies and/or interstitial oxygen ions may be rearranged by applying a voltage to the resistive memory cell. The adjacent material may comprise amorphous silicon, germanium, silicon oxide, aluminum oxide, tantalum oxide, etc.

In one embodiment, the ligands 51 comprise an organic material, such as at least one of functionalized alkyl chains or polymeric ligands. In case polymeric ligands are employed, the polymeric ligands can provide the following attributes either alone or in combination depending on embodiments. The polymeric ligands of the embodiments of present disclosure may facilitate uniform deposition and uniform filling of cell cavities from spin coating and solvent annealing. The polymeric ligands of the present disclosure may provide a uniform spacing and a regular assembly of the nanoparticles during solvent annealing. The spacing provided between particles and the presence of the polymeric matrix made by the ligands may be exploited to fabricate multilevel cells. The spacing provided between particles and the presence of the polymeric matrix may enable infiltration synthesis within the polymeric matrix using atomic layer deposition precursors. This, in turn, may enable the fabrication of cells similar to "projected memory cells" but with better control of the switching volume of the phase change material.

In some embodiments, ligand-grafted nanoparticles can fill deep trenches conformally and uniformly because they are solution processed. The composition and stoichiometry is not affected by the depth of the cell to be filled, whereas ALD or PECVD deposition methods suffer from uniformity issues when trenches are too deep.

Ligand-grafted nanoparticles (51, 52) include nanoparticle cores 52 (which can include a chalcogenide or metal oxide material) that are tethered by ligand chains 51 as shown in the FIG. 1A. Ligand-grafted nanoparticles can be dissolved in organic solvents and then deposited over a substrate. Once the solvent evaporates, the nanoparticles (51, 52) assemble closely together. The polymeric chains interpenetrate each other but also prevent the particles from touching.

Referring to FIG. 1B, a first exemplary resistive memory cell is illustrated during manufacture before drying the liquid dispersion 250. A first electrode 20 comprising a conductive material is formed on a substrate 10. Nanoparticles 52 capped with organic or polymeric ligands 51 are dissolved in a solvent 54 to provide a liquid dispersion 250. The liquid dispersion 250 including the ligand-grafted nanoparticles (51, 52) is dispensed from a container 150 onto a top surface of the first electrode 20 employing an applicator 920. The method of application may be selected from, but is not limited to, spin-coating, dip-coating, drop-casting, spraying, ink-jet printing and print-transfer. As used herein, a "liquid dispersion" refers to a liquid solution in which particles are suspended.

In an illustrative example, the ligand-grafted nanoparticles (51, 52) are deposited onto the substrate 10 by spin coating. For example, the liquid dispersion 250 of the ligand-grafted nanoparticles (51, 52) can be spin-coated onto the substrate 10 to form a film with uniform coverage over the wafer. Film coverage can be tuned to range from sub-monolayer to several tens of layers.

Referring to FIG. 1C, a drying process can be performed. When dried, the ligand-grafted nanoparticles (51, 52) form a dense array with the ligands interpenetrating and forming a uniform matrix 53. Thus, the assembled material forms a composite of nanoparticles 52 embedded in a polymeric matrix 53 formed by the ligands 51 as shown in FIG. 1C. It is understood that evaporation of the carrier solvent from the liquid dispersion 250 results in conversion of the liquid dispersion into a film, which is no longer a liquid. The film contains the combination of the matrix 53 and the nanoparticle cores 52. If polymer-grafted nanoparticles are provided in the liquid dispersion, the film can be a film of polymer-grafted nanoparticles. The ligands 51 keep the particles at a uniform distance and form an embedding polymer matrix 53. In subsequent drawings, the individual polymeric chains are omitted for clarity and are replaced by the uniform matrix 53 formed by them. While the individual polymeric chains are not expressly shown in subsequent drawings, it is understood that polymeric chains are present in a continuous embedding matrix formed by the polymers.

Referring to FIG. 1D, a solvent annealing step can be optionally used to facilitate self-assembly that rearranges the nanoparticles 52. For example, the substrate 10 can be taken into a solvent annealing chamber 930 where the film is exposed to a controlled vapor pressure of a suitable solvent (Toluene, MIBK, MEK, Acetone, DMF, etc). The polymers in the soft coronas of the particles swell and facilitate rearrangement of the particle assembly into a uniform, ordered structure.

The combination of the nanoparticles 52 and the matrix 53 constitute a variable resistance region including the nanoparticle cores 52. A second electrode (not shown) can be formed on the variable resistance region to form a resistive memory cell.

Recesses, openings, trenches, cavities or other geometries can be formed over the substrate 10 prior to application of the liquid dispersion 250. For example, an insulating layer can be formed over the first electrode 20, and an opening can be formed through the insulating layer, and can be filled by the nanoparticles 52 and the matrix 53 to define a memory cell.

Figure 2B:
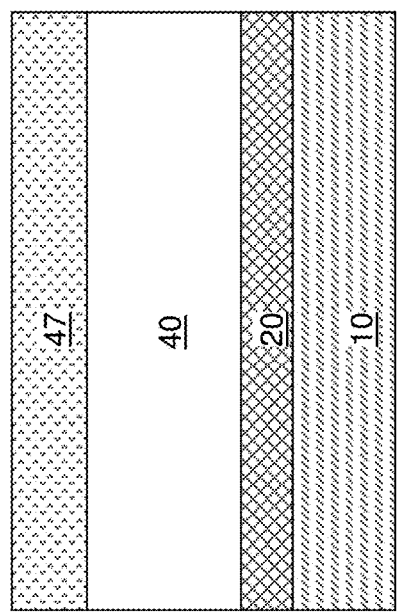
Figure 2C:
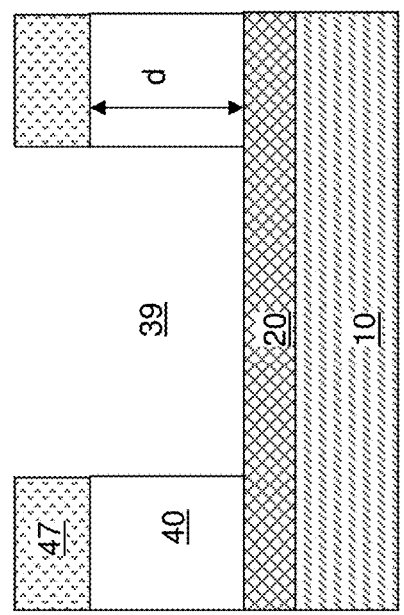

Referring to FIGS. 2A-2C, a fabrication process is illustrated for forming an opening 39 in an insulating layer 40 over a first electrode 20. The first electrode 20 can be deposited on the substrate 10, for example, by sputtering, vapor deposition, ion beam deposition, ALD, etc. as illustrated in FIG. 2A. An insulating layer 40 including a dielectric material (e.g., silicon oxide) can be deposited on the first electrode 20. A resist material layer 47 can be formed on the insulating layer, which may be a photoresist, an e-beam resist, a nanoimprint resist or a block copolymer.

Referring to FIG. 2B, an opening can be patterned in the resist material layer 47, for example, by lithographic exposure and development, or by imprinting. The maximum lateral dimension L of the opening can be, for example, in a range from 1.2 times the maximum lateral dimension of the ligand-grafted nanoparticles (51, 52) to 100,000 times the maximum lateral dimension of the ligand-grafted nanoparticles (51, 52).

Referring to FIG. 2C, an opening 39 extending through the insulating layer 40 can be formed by an etch process that employs the patterned resist material layer 47 as an etch mask. The etch process can be an anisotropic etch process or an isotropic etch process. The depth d of the opening can be the same as the thickness of the insulating layer 40, which may be in a range from 1 nm to 10 microns. A top surface of the first electrode 20 is physically exposed at a bottom of the opening 39. The patterned resist material layer 47 can be removed at this time (e.g., by ashing) or left over the insulating layer 40 to serve as a lift-off layer in a subsequent step shown in FIGS. 3A to 4C.

Figure 3B:
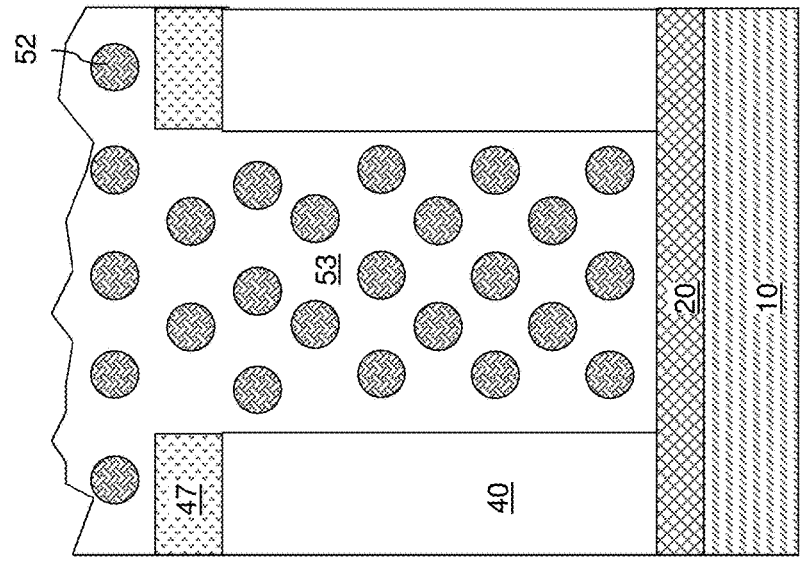
FIGS. 3A, 3B, and 3C schematically illustrate polymer-grafted nanoparticles assembled inside different configurations of the first exemplary resistive memory cell, each including an opening having different sizes and aspect ratios according to the first embodiment of the present disclosure.
Figure 3A:
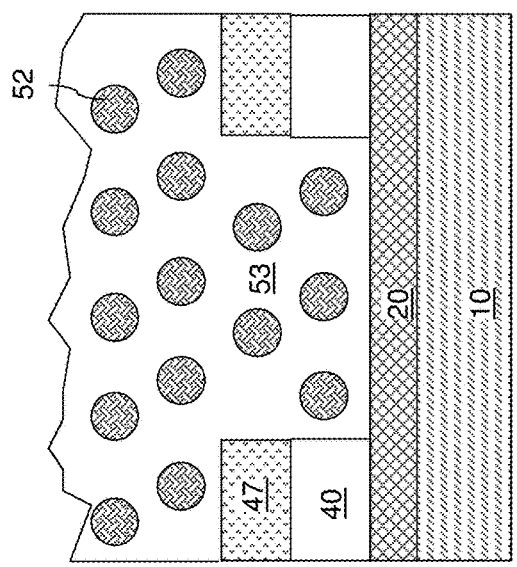
Figure 3C:
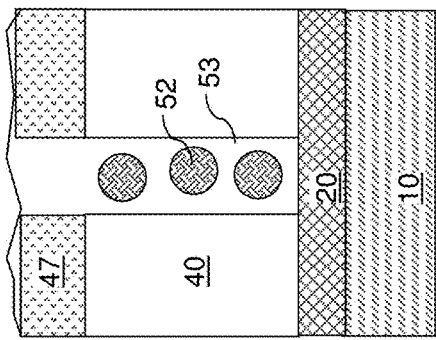

FIGS. 3A-3C show a subsequent processing step in which a liquid dispersion 250 is applied and dried to form a combination of a matrix 53 (which may be a polymerized matrix) and nanoparticle cores 52. It is understood that evaporation of the carrier solvent from the liquid dispersion 250 results in conversion of the liquid dispersion into a film, which is no longer a liquid. The film contains the combination of the matrix 53 and the nanoparticle cores 52. If polymer-grafted nanoparticles are provided in the liquid dispersion, the film can be a film of polymer-grafted nanoparticles.

FIGS. 3A-3C illustrate different configurations of openings having different sizes and aspect ratios. For example, the thickness of the insulating layer 40 can be within a range from the maximum thickness of the ligand-grafted nanoparticles (51, 52) to twice the maximum thickness of the ligand-grafted nanoparticles (51, 52) as illustrated in FIG. 3A. Alternatively, the thickness of the insulating layer 40 and the maximum lateral dimension of the opening 39 in the insulating layer 40 can be more than twice the maximum thickness of the ligand-grafted nanoparticles (51, 52) as illustrated in FIG. 3B. Yet alternatively, the maximum lateral dimension of the opening 39 through the insulating layer 40 can be less than twice the maximum lateral dimension of the ligand-grafted nanoparticles (51, 52) and the opening 39 can be configured to accommodate a vertical stack of multiple ligand-grafted nanoparticles (51, 52) as illustrated in FIG. 3C. Any intermediate configuration among FIGS. 3A-3C can also be employed. Application of the liquid dispersion 250 and formation of the combination of the matrix 53 and nanoparticle cores (i.e., nanoparticles) 52 may be performed employing the methods described above, or employing any of the methods to be described below.

Figure 4B:
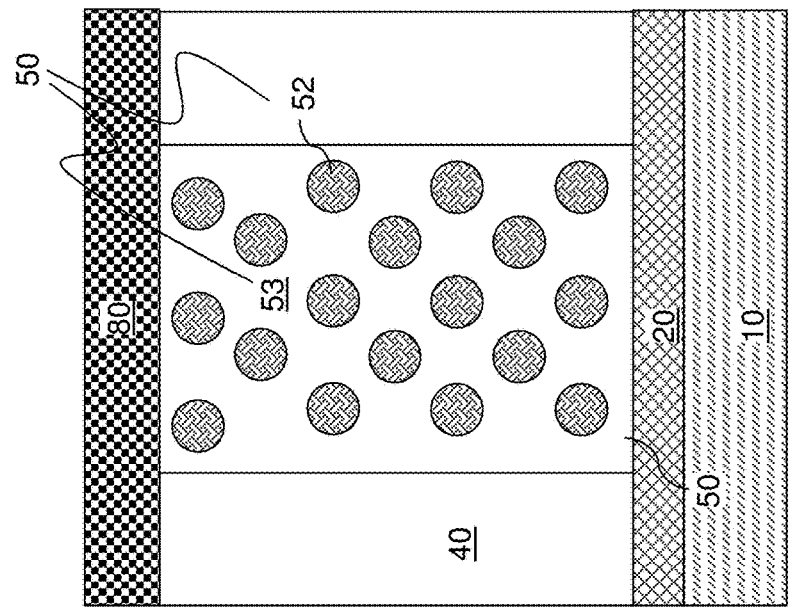
FIGS. 4A, 4B, and 4C illustrate various configurations of the first exemplary resistive memory cell after removal of the polymer matrix by a heat treatment and/or exposing the sample to an acid or solvent vapor that detaches the ligands, and deposition of a second electrode according to the first embodiment of the present disclosure.
Figure 4A:
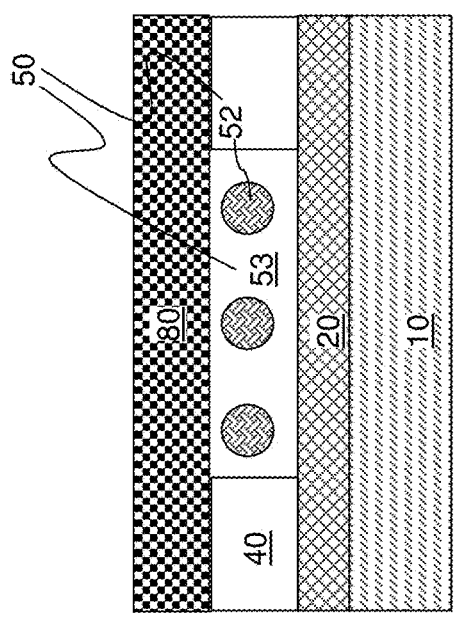
Figure 4C:
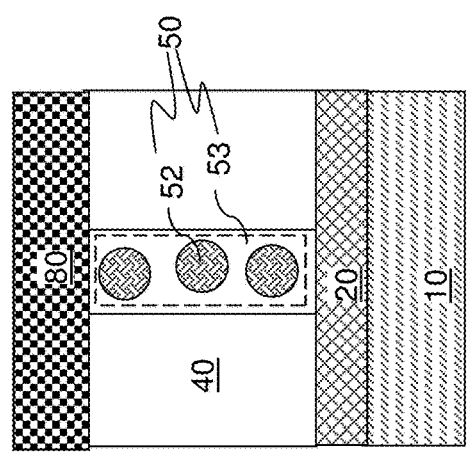

FIGS. 4A-4C, the resist material layer 47 can be removed, for example, by dissolution in a solvent, by lift-off, or by ashing to lift off the portion of the matrix 53 located over layer 47 and to leave another portion of the matrix 53 in the opening 39.

A second electrode 80 is formed on a top surface of the insulating layer 40 by deposition of a conductive material, which may be a metallic material (e.g., TiN, TaN, W, Al, Cu, Pt, Ti, etc.) or a heavily doped semiconductor material (such as doped silicon including p-type dopants or n-type dopants at an atomic concentration greater than $1.0 \times 10^{20}/cm^3$). Additional memory device levels can be formed over the devices of FIGS. 4A, 4B and 4C to form a three dimensional ReRAM device. In one embodiment, at least 50% (which may be more than 80% and/or more than 90%) of all nanoparticle cores 52 in the matrix 53 do not physically contact any other nanoparticle core 52 within the matrix 53.

The first exemplary memory cells illustrated in FIGS. 4A-4C are examples of a fully enclosed memory cell with a single type of nanoparticle core 52. A cavity (i.e., an opening) in the form of a trench or a well is fabricated in an insulating layer 40. The cavity is filled with nanoparticle cores 52 including a first resistive memory material and embedded in a matrix 53 including a matrix material. One of the first electrode 20 and the second electrode 80 can be a bottom electrode having a planar top surface contacting the matrix 50, and another of the first electrode 20 and the second electrode 80 can be a top electrode having a planar bottom surface contacting the matrix 50. The various dimensions of the first exemplary memory cells can vary to contain anywhere from one to hundreds, thousands, or millions, of nanoparticle cores 52 in a mono-layer arrangement (such as the configuration of FIG. 4A), in a multilayer arrangement (such as the configuration of FIG. 4B), or in a columnar arrangement (such as the configuration of FIG. 4C).

Figure 5A:
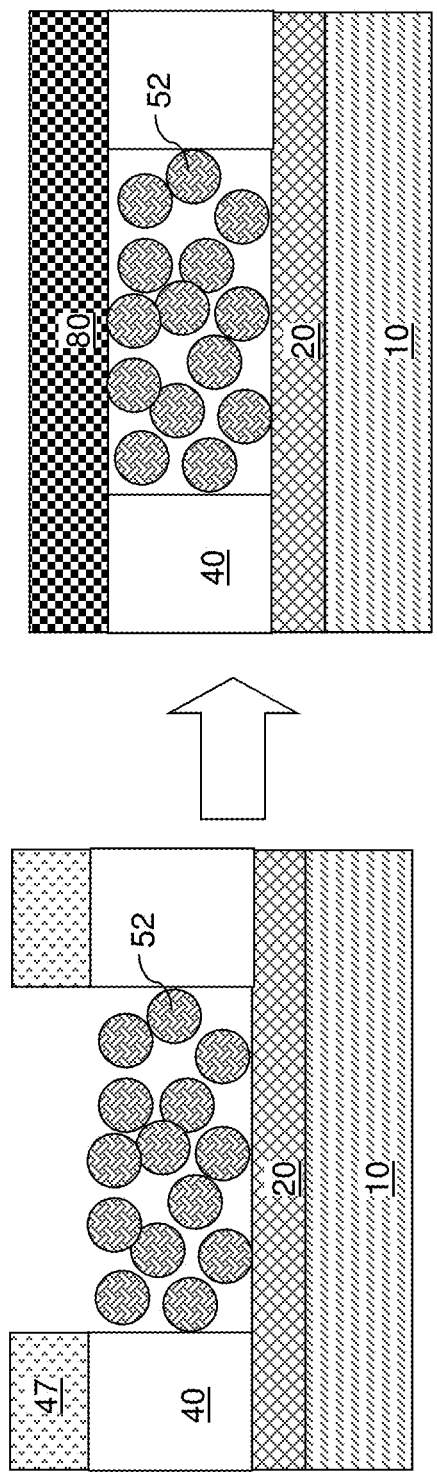
Figure 5B:
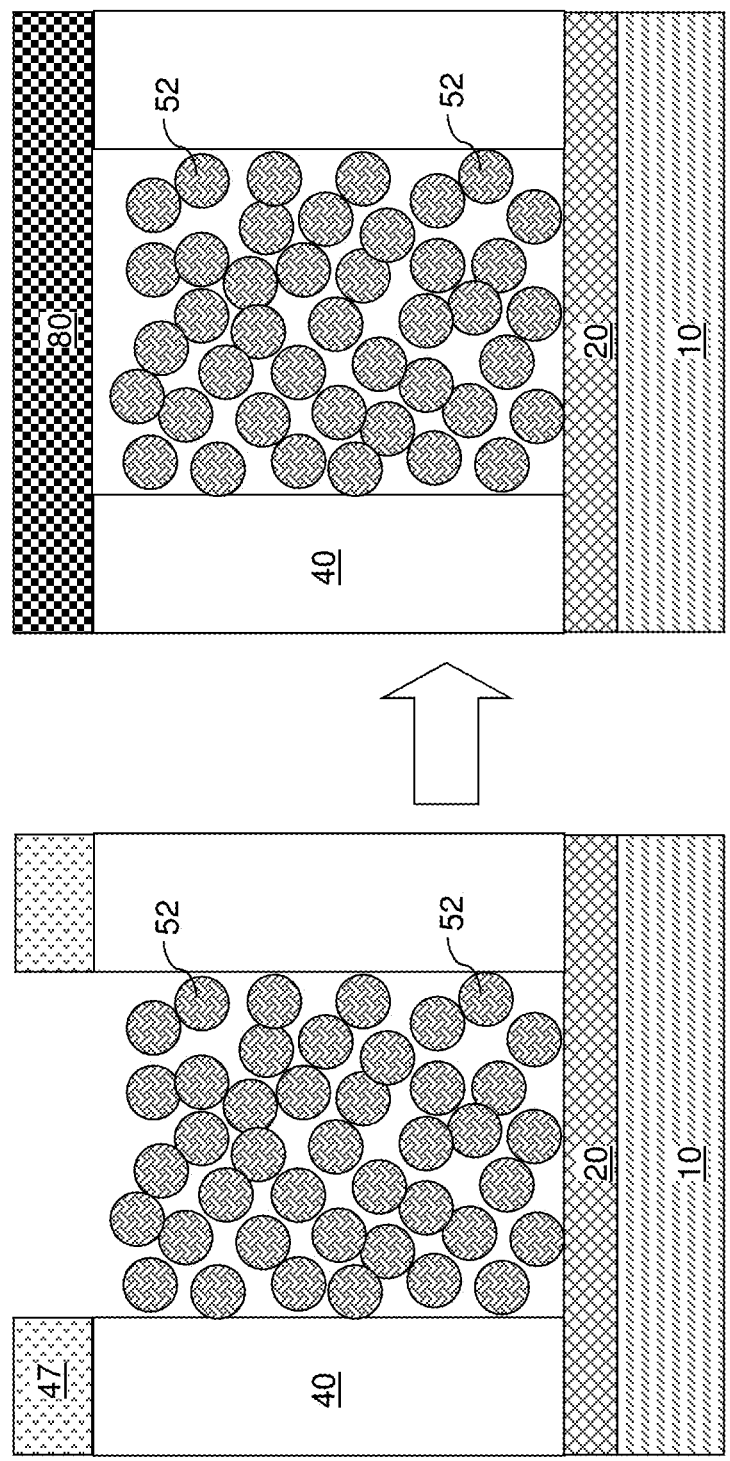

According to another aspect of the present disclosure, the ligands 51 or the matrix 53 can be removed prior to formation of the second electrode 80. FIGS. 5A, 5B, and 5C illustrate a manufacturing process for first, second, and third configurations of a second exemplary resistive memory cell in which the ligands 51 are removed, or the matrix 53 is removed, prior to formation of a second electrode 80 according to a second embodiment of the present disclosure. After application of the liquid dispersion 250 into the openings 39, the ligands 51 or the matrix 53 derived from the liquid dispersion 250 can be removed employing at least one process selected from thermal decomposition, plasma treatment or exposure to a solvent or acid vapor that detaches the polymeric ligand from the nanoparticle cores 52. For example, the ligands 51 can be removed by thermal decomposition and/or by exposing the sample to a solvent or acid vapor that detaches the polymer from the nanoparticle cores 52.

Upon removal of the ligands 51, the nanoparticles 52 collapse, and optionally may be sintered, as depicted in FIGS. 5A, 5B, and 5C. In this case, the nanoparticles 52 can contact other nanoparticles 52 to provide a continuous path consisting of a subset of the nanoparticles 52 between the first electrode 20 and the second electrode 80 after removal of the ligands 51. In this embodiment, there is no matrix material in the final memory device. In one embodiment, at least 50% (such as more than 80% and/or more than 90%) of all nanoparticles 52 can contact another nanoparticle 52 after removal of the ligands 51. The assembly of the nanoparticles 52 constitutes a matrix free variable resistance region in this embodiment.

Subsequently, a second electrode 80 is deposited on top of the assembly of the nanoparticle cores 52 as illustrated in the right-side drawings of FIGS. 5A, 5B, and 5C. Additional memory device levels can be formed over the devices of FIGS. 5A, 5B and 5C to form a three dimensional ReRAM device.

Figure 6:
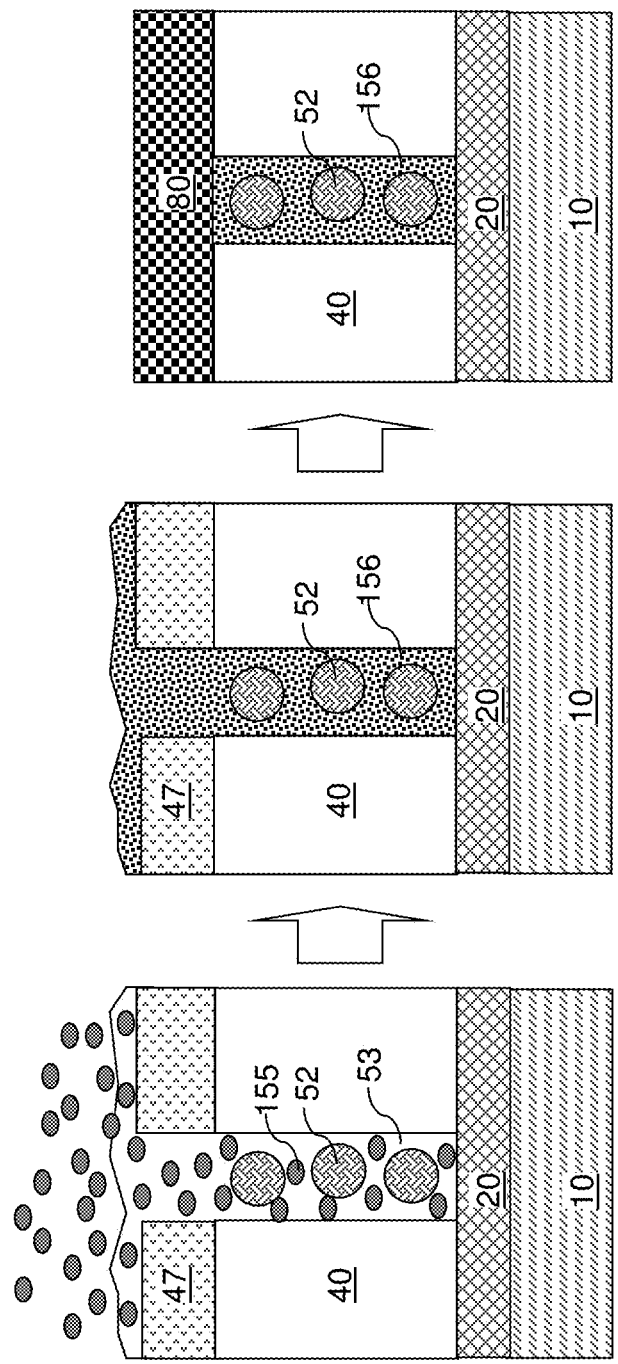
FIG. 6 illustrates the processing steps of ALD infiltration synthesis, polymer removal, matrix hardening, liftoff, and second electrode deposition for manufacture of a third exemplary resistive memory cell according to a third embodiment of the present disclosure.

Referring to FIG. 6, a third exemplary resistive memory device according to a third embodiment of the present disclosure is illustrated. In the third embodiment, the matrix 53 (which may be an organic matrix, such as a polymer matrix) provided at the processing steps of FIGS. 3A-3C can be backfilled (i.e., replaced) by infiltration atomic layer deposition (ALD) synthesis. In this embodiment, the organic matrix may be replaced by an inorganic matrix. The fabrication can be the same as in the first embodiment up to deposition and optional annealing of the ligand-grafted nanoparticles (51, 52) in the openings 39 as shown in FIGS. 3A-3C. Subsequently, the exemplary resistive memory device can be placed in an ALD chamber where the matrix 53 is exposed to molecules of the precursor material 155 of an ALD process that are supplied in a vapor phase. Molecules of the precursor material 155 infiltrate the matrix 53 and either grow material around the nanoparticle cores 52 or along the polymer chains of the matrix 53 depending on the functionality of the polymer chains. This process is referred to as an atomic layer deposition infiltration process, and induces infiltration of the precursor material 155 into the matrix 53. In one embodiment, the precursor material 155 forms a modified matrix 156 (i.e., a new matrix) upon reaction with, or substitution of, the material in the ligand-grafted nanoparticles 51 (which can be in the form of the matrix 53).

In one embodiment, the precursor material 155 can react with the ligands 51 (as incorporated into the matrix 53) to form a semi-insulating material. If the precursor material 155 binds to the polymeric chains of the matrix 53, then the ALD synthesis occurs along the chains in the matrix 53. This forms a permanent matrix, such as an inorganic matrix, which is herein referred to as a modified matrix 156. Optionally, unreacted portions of the initial matrix 53 may be subsequently removed selective to the modified matrix 156.

Alternatively, if the polymer chains are inert to the precursors, the ALD synthesis can occur around the nanoparticle cores 52. In this case, the ligand-grafted nanoparticles (51, 52) can comprise nanoparticle shells (located between nanoparticle cores 52 and the ligands 51; not expressly shown) that enclose a respective one of the nanoparticle cores 52 and are directly attached to the ligands 51, and the ligands can be inert to the precursor material. In this case, the precursor material can react with the nanoparticles shells to form the semi-insulating or insulating material of the modified matrix 156.

After the ALD infiltration synthesis, any remaining portion of the initial polymer matrix 53 may be optionally removed by plasma treatment ($O_2$, $CO_2$, $H_2$—Ar, $CHF_3$, and/or $CF_4$), or by a heat treatment. The polymer removal step can be followed by the permanent matrix hardening step to harden the modified matrix 156 (i.e., the permanent matrix) formed by ALD. If an optional resist material layer 47 (such as a liftoff layer) is employed, such a resist material layer 47 can be removed thereafter. Next, a second electrode 80 is deposited to form a resistive memory cell.

In one embodiment, at least 50% (which may be more than 80% and/or more than 90%) of all nanoparticle cores 52 in the matrix 156 do not physically contact any other nanoparticle core 52 within the matrix 156. The inorganic matrix 156 can prevent direct contact among a predominant portion (i.e., at least 50%) of neighboring pairs of nanoparticle cores 52.

In one embodiment, the combination of metal oxide nanoparticles 52 and inorganic matrix 156 constitute a variable resistance region 50 of barrier modulated cell (BMC). The inorganic matrix 156 forms the barrier of the BMC and acts as an oxygen scavenger or reservoir for interstitial oxygen ion diffusion into and out of the metal oxide nanoparticles 52.

For example, the inorganic matrix material 156 may be, but is not limited to, amorphous silicon, silicon oxide, tantalum oxide, and germanium. The metal oxide nanoparticles 52 comprise a metal oxide material selected from titanium oxide, hafnium oxide, zinc oxide, vanadium oxide, niobium oxide, tantalum oxide, strontium titanate and tin oxide for use in a barrier modulated cell (BMC). Examples of metal oxide materials include a slightly sub-stoichiometric metal oxide such as $TiO_2$, $SrTiO_{3-\delta}$, $NbO_{2-\delta}$, or Nb:Sr-$TiO_{3-\delta}$ where value of $\delta$ can be independently selected from a range from 0 to 0.5, such as greater than zero to 0.15 (i.e., to form a sub-stoichiometric, oxygen deficient metal oxide). For example, the metal oxide material may be titanium oxide, such as sub-stoichiometric titanium oxide having less than two oxygen atoms for each titanium atom.

The variable resistance region 50 provides different resistance between the first electrode 20 and the second electrode 80 depending on the state of the metal oxide nanoparticles 52 and the inorganic matrix 156. For example, an energy barrier is formed at the interface between the inorganic matrix 156 and the nanoparticles 52. The energy width and energy height of the barrier may be modulated by the diffusion of oxygen vacancies and/or interstitial oxygen ions in and out of the interface. The modulation of the energy band structure at the interface between the inorganic matrix 156 and the nanoparticles 52 can provide a change to the overall resistivity of the variable resistance region. The vacancies and/or interstitial oxygen ions may be rearranged by applying a voltage to the resistive memory cell.

In another embodiment, the resistive memory cell comprises a projected memory cell, such as the cell described in Koelmans, W. W.; Sebastian, A.; Jonnalagadda, V. P.; Krebs, D.; Dellmann, L.; Eleftheriou, E., Projected Phase-Change Memory Devices. *Nature communications* 2015, 6, incorporated herein by reference in its entirety. In a projected memory cell, the physical mechanism of resistance storage in a phase change memory material is decoupled from the information-retrieval process by providing a projection material between the two cell electrodes having a resistivity $\rho_m$ which is between the low and high resistance states of the phase change memory material (i.e., $\rho_l < \rho_m < \rho_h$ where $\rho_l$ and $\rho_h$ represent the resistivity of low resistance (i.e., crystalline state) and high resistance (e.g., amorphous state) states, respectively, of the phase change memory material). During the reading operation, the current flows through the projection material between the electrodes rather than through the phase change memory material in the high resistance state (e.g., in the amorphous state).

Referring to FIGS. 7A and 7B, a fourth exemplary resistive memory cell according to a fourth embodiment of the present disclosure is illustrated. The memory cell is a projected memory cell, includes a "projection material", i.e., a thin conformal layer of a different material with an electrical resistivity $\rho_m$. This material can be conformally coated on the sidewalls of the opening through the insulating layer 40 and on the physically exposed portion of the top surface of the first electrode 20 to form a projection material liner 254. For example, the projection material liner 254 may comprise a TiN liner for chalcogenide phase change material nanoparticles 52. The projection material liner 254 can be formed by ALD or PECVD. The projection material liner 254 deposited at the top of the first electrode 20 and on the top surface may remain as illustrated in FIG. 7A, or may be etched back by an anisotropic etch to form a cylindrical projection material liner 256 as illustrated in FIG. 7B. Then, the processing steps of the first or second embodiment can be followed to produce a nanoparticle-based resistive memory cell. The resistivity of the projection material is tuned so that the cell is more stable during reading.

Referring to FIGS. 8A and 8B, a fifth embodiment of the present disclosure is illustrated. The projected memory cell with projection material of the fourth embodiment is used followed by the steps of the third embodiment as to produce a cell with nanoparticle cores 52 surrounded by a modified matrix 156 formed by the ALD infiltrated material.

Figure 9C:
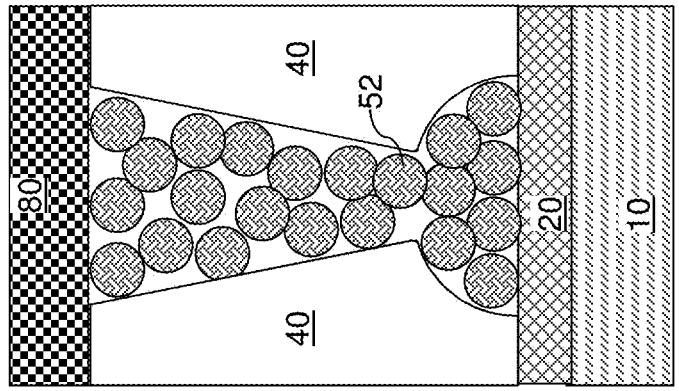
FIGS. 9A-9C illustrate sixth exemplary memory cells with a constriction zone between the second electrode and the first electrode according to a sixth embodiment of the present disclosure. Nanoparticles may be formed according to any of the first through third embodiments.
Figure 9B:
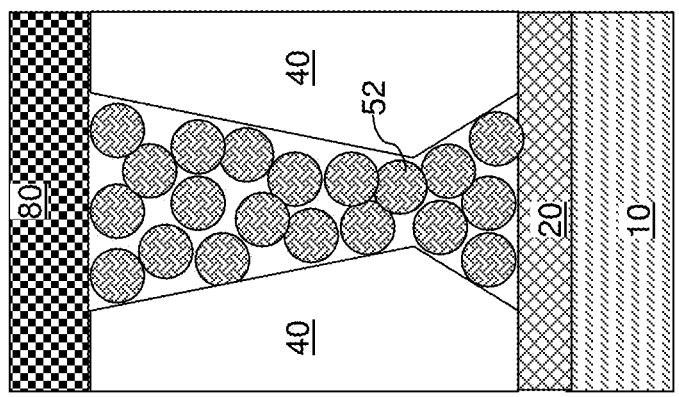
Figure 9A:
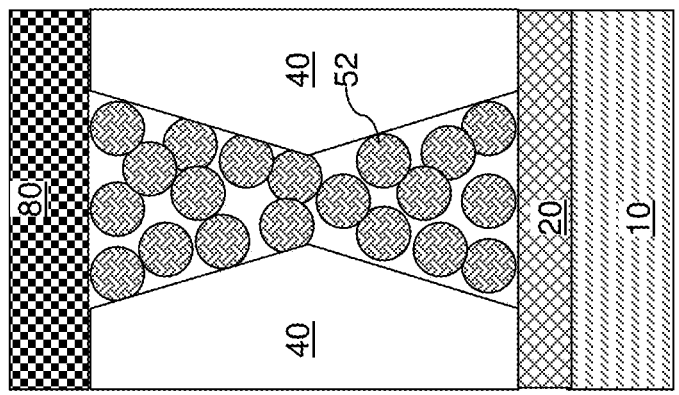

Referring to FIGS. 9A-9C, a sixth exemplary resistive memory cell according to a sixth embodiment of the present disclosure is illustrated. An opening is formed through an insulating layer 40 as in the first embodiment with a modification that induces formation of a constriction zone. For example, a sacrificial frustum including a sacrificial material such as polysilicon or carbon can be formed over the first electrode 20 with a thickness that is greater than the height of the sacrificial frustum. The patterning of the sacrificial frustum can be performed with a lithographic patterning of a photoresist layer and a taper-inducing etch (that includes a combination of an isotropic etch and an anisotropic etch) that employs the patterned photoresist layer as an etch mask. Another taper-inducing etch can be performed through an upper portion of the insulating layer 40 to expose a top surface of the sacrificial frustum, which is subsequently removed selective to the insulating layer 40.

The region having the smallest horizontal cross-sectional area within the opening through the insulating layer 40 is a constriction zone. Thus, the constriction zone has a horizontal cross-sectional area that is less than a horizontal cross-sectional area of a top periphery of the opening and is less than a horizontal cross-sectional area of a bottom periphery of the opening.

Subsequently, the processing steps of any of the preceding embodiments can be performed. The opening through the insulating layer 40 has a narrowing between top and first electrodes (20, 80). The narrowed dimension restricts the number of nanoparticle cores 53 that can occupy the space, thus reducing the switching volume. The constriction generates a higher current density (amps/unit area) in the constriction zone, thus increasing the temperature rise in that zone. The combination of reduced volume and higher current density will enhance phase transformation, i.e. reduced current to reset/amorphize.

Referring to FIGS. 10A and 10B, a seventh resistive memory cell according to a seventh embodiment of the present disclosure includes a barrier modulated cell (BMC). In FIG. 10A, the combination of metal oxide nanoparticles 52 and inorganic matrix 356 constitute a variable resistance region 50 of barrier modulated cell (BMC). The inorganic matrix 356 forms the barrier of the BMC and acts as an oxygen scavenger or reservoir for interstitial oxygen ion diffusion into and out of the metal oxide nanoparticles 52. The inorganic matrix 356 may be the same as the modified matrix 156 formed by infiltration atomic layer deposition (ALD) synthesis. Alternatively, the inorganic matrix 356 may be a different matrix material formed by a method other than infiltration atomic layer deposition (ALD) synthesis.

For example, the inorganic matrix material 356 may be, but is not limited to, amorphous silicon, silicon oxide, tantalum oxide, and germanium. The metal oxide nanoparticles 52 comprise a metal oxide material selected from titanium oxide, hafnium oxide, zinc oxide, vanadium oxide, niobium oxide, tantalum oxide, strontium titanate and tin oxide for use in a barrier modulated cell (BMC). Examples of metal oxide materials include a slightly sub-stoichiometric metal oxide such as $TiO_{2-\delta}$, $SrTiO_{3-\delta}$, $NbO_{2-\delta}$, or Nb:Sr-$TiO_{3-\delta}$ where value of $\delta$ can be independently selected from a range from 0 to 0.5, such as greater than zero to 0.15 (i.e., to form a sub-stoichiometric, oxygen deficient metal oxide). For example, the metal oxide material may be titanium oxide, such as sub-stoichiometric titanium oxide having less than two oxygen atoms for each titanium atom.

Referring to FIG. 10B, multiple types of nanoparticles (52, 62) are formed in the BMC. Thus, in addition to the nanoparticles 52 (which are herein referred to as first nanoparticles) provided in the liquid dispersion 250, additional nanoparticles 62 (which are herein referred to as second nanoparticles) having a different composition than the nanoparticles 52 can be introduced into the dispensed liquid dispersion 250, and can be subsequently applied over a first electrode 20 (such as within an opening in the insulating layer 40). The additional nanoparticles 62 comprise another material that is selected from a conductive metal oxide or a semiconducting metal oxide above. In this case, an enclosed resistive memory cell with a blend of nanoparticles (52, 62) can be formed.

The two or more distinct materials that are blended at a specific molar ratio. When each type of nanoparticles (52, 62) is relatively monodisperse within the liquid dispersion 250, regular and periodic superlattices can be obtained in the matrix (53, 156, 356) or without a matrix (e.g., in the configuration shown in FIGS. 5A-5C). In this case, each type of nanoparticle occupies specific sites on the superlattice. In this way, by tuning the mean sizes of each population in the blend and their molar fractions, it is possible to design how the superlattice will assemble inside the resistive memory cell. FIG. 10B illustrates a specific example, but other cell geometries can also be employed. Various size ratios of nanoparticles (52, 62) and different blends of more than two types of nanoparticles (52, 62) can also be employed.

In addition, the feature of the mixture of multiple (e.g., two, three, four, etc.) types of nanoparticles (52, 62) in the seventh embodiment can be incorporated into each of the preceding exemplary resistive memory cells by substitution of the respective liquid dispersion 250.

Referring to FIG. 11, an eighth resistive memory cell according to an eighth embodiment of the present disclosure includes nanoparticles 72, which can be employed in lieu of the nanoparticle cores 52 in any of the previously described embodiments. The nanoparticle 72 can include an inner core 74 that comprises a first material, and an outer shell 76 that surrounds the inner core 74 and comprises a second material that is different from the first material. Each of the first material and the second material can be independently selected from conductive metal oxides, semiconducting metal oxides, and chalcogenide materials (such as chalcogenide phase change materials) with the proviso that the second material is different from the first material. A fully enclosed memory cell with core-shell type nanoparticles 72 is provided.

The outer shell 76 of each nanoparticle 72 surrounds the inner core 74 to add functionality to the electronic, optical and/or catalytic properties to the nanoparticle 72. In particular, the second material of the outer shell 76 can be chosen to promote the charge separation of electron-hole pairs as in a material pair. An example of such a material pair is inner nanoparticle core 74 including $TiO_2$ and the outer nanoparticle shell 76 including $SnO_2$.

Optionally, blends of nanoparticles 72 with different inner core materials or different outer shell materials or both can be employed to add additional functionality. In addition, the feature of at least one type of nanoparticles 72 including a respective inner core 74 and a respective outer shell 76 in the eighth embodiment can be incorporated into each of the preceding exemplary resistive memory cells by substitution of at least one type of nanoparticles 72 of the eighth embodiment for the nanoparticles 52 of previous embodiments. For example, the nanoparticles 72 may be located in the BMC described above, in which the inner core 74 comprises the metal oxide (e.g., sub-stoichiometric titanium oxide) and the outer shell 76 comprises the barrier material, such as amorphous silicon, germanium, silicon oxide, tantalum oxide, aluminum oxide, etc.

Figure 12A:
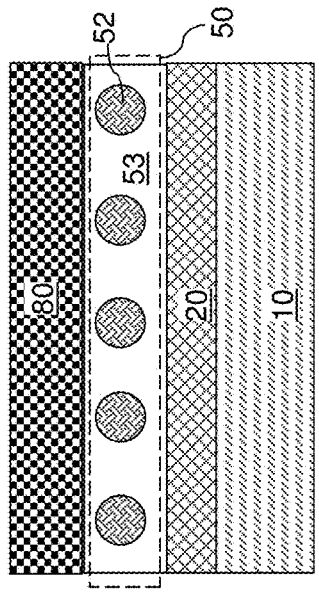
FIG. 12A is a perspective view of a first configuration of a ninth exemplary memory cell including planar layers according to an eighth embodiment of the present disclosure.
Figure 12B:
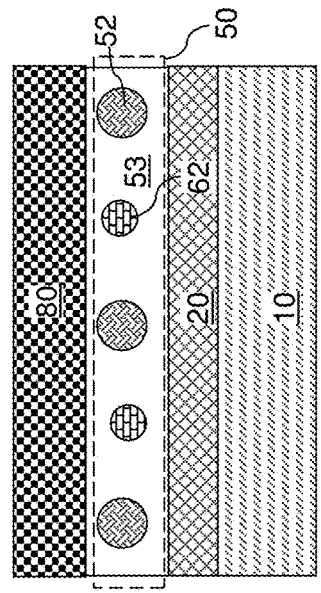
FIG. 12B is a schematic vertical cross-sectional view of the first configuration of the ninth exemplary memory cell of FIG. 12A.
Figure 12C:
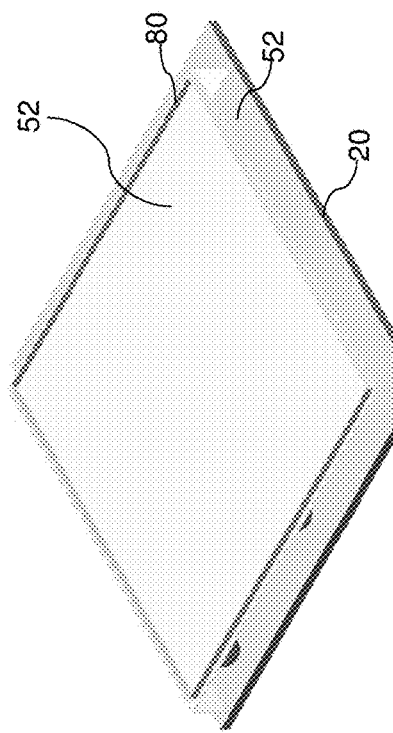
FIG. 12C is a perspective view of a second configuration of the ninth exemplary memory cell including planar layers according to an eighth embodiment of the present disclosure.
Figure 12D:
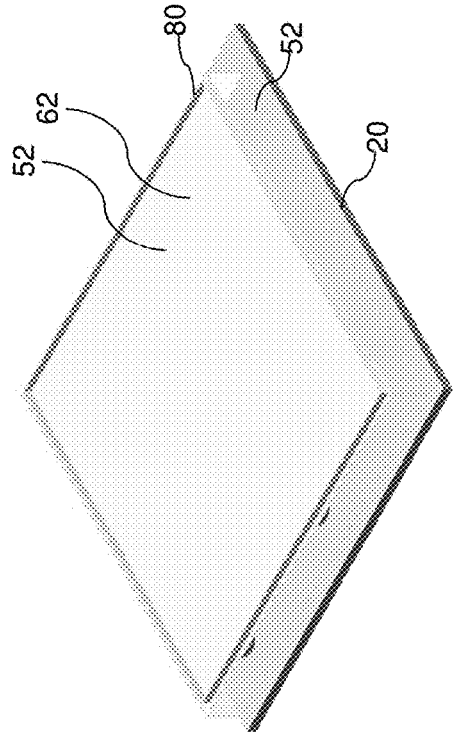
FIG. 12D is a schematic vertical cross-sectional view of the second configuration of the ninth exemplary memory cell of FIG. 12C.

According to a ninth embodiment of the present disclosure, nanoparticle-based memory cells can include a thin film of nanoparticle assemblies or nanocomposites. FIGS. 12A and 12B illustrate a first configuration employing only one type of nanoparticle cores 52, and FIGS. 12C and 12D illustrate a second configuration employing multiple types of nanoparticles (52, 62), which can be a blend of two or more types of nanoparticles (52, 62).

A first electrode 20 can be formed on a top surface of a substrate 10. A thin film including one monolayer of nanoparticles {52, {52, 62}, or 72} or 2-10 monolayers of nanoparticles {52, {52, 62}, or 72} can be formed by applying a liquid dispersion 250 directly on the top surface of the first electrode 20. A patterned insulating layer 40 may, or may not, be omitted. Correspondingly, the variable resistance region 50 can be formed as a patterned layer or as a blanket (unpatterned) layer. A second electrode 80 can be formed on the variable resistance region 50 as a blanket film. The second electrode 80, the variable resistance region 50, and/or the first electrode 20 may be subsequently patterned, for example, by application and lithographic patterning of a photoresist layer and an etch process employing the photoresist layer as an etch mask.

In one embodiment, the first electrode 20 can be formed as a planar layer over the substrate 10, and a matrix derived from a liquid dispersion 250 can be formed on a top surface of the first electrode 20. In one embodiment, the thickness of the matrix formed from the liquid dispersion 250 can be less than twice the maximum dimension of the ligand-grafted nanoparticles (51, 52). In this case, the thickness of the variable resistance region 50 can be less than twice the maximum dimension of a nanoparticle 52. The second electrode 80 can be formed on the variable resistance region 50.

Figure 13:
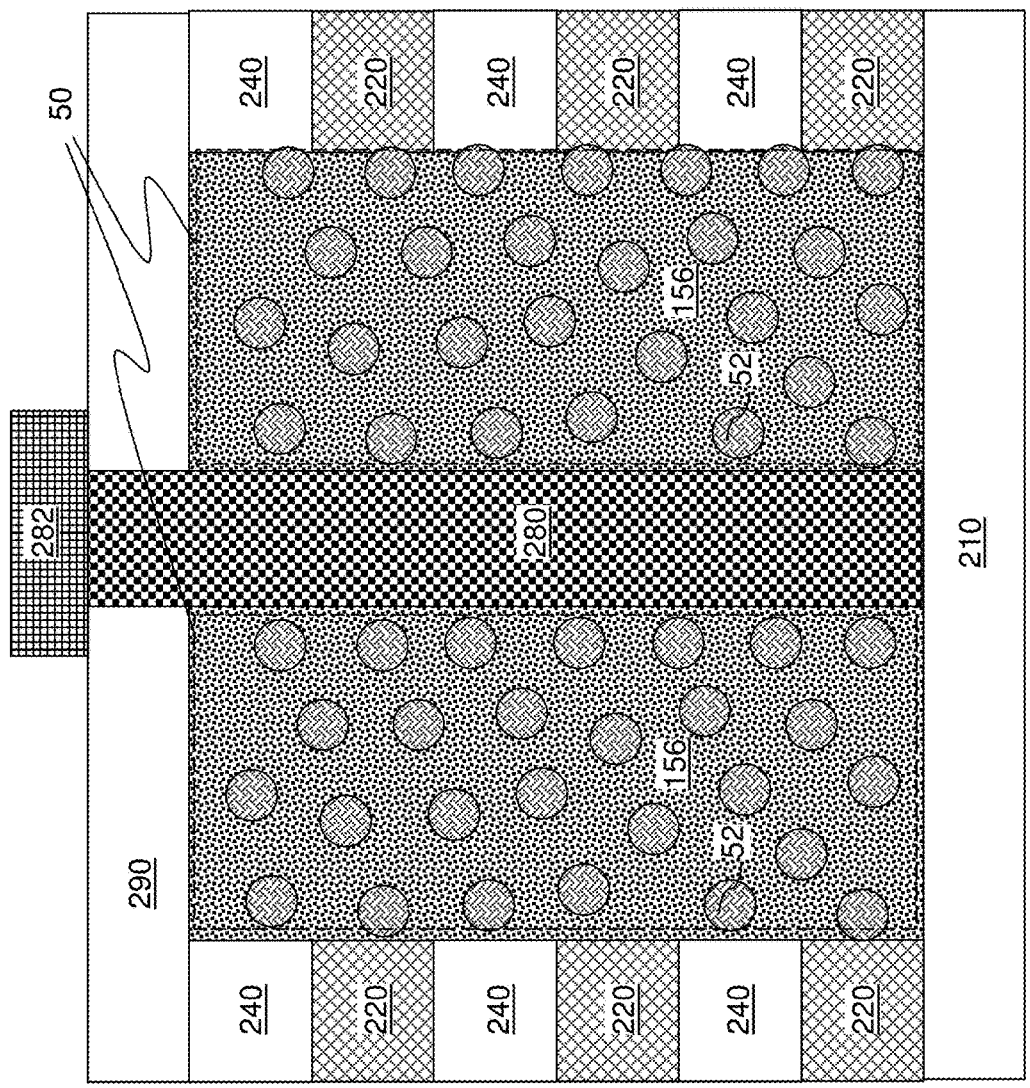
FIG. 13 is vertical cross-sectional view of a tenth exemplary memory cell according to a tenth embodiment of the present disclosure.

Referring to FIG. 13, a tenth exemplary memory cell according to a tenth embodiment of the present disclosure is illustrated. An alternating stack of insulating layers (e.g., silicon oxide) 240 and electrically conductive layers (e.g., TiN and/or W) 220 can be formed over a substrate 210. The substrate 210 may comprise a silicon substrate that includes an overlying insulating material such as silicon oxide, glass, a dielectric metal oxide, and/or silicon nitride. Each of the insulating layers 240 and each of the electrically conductive layer 220 can have a respective thickness in a range from 10 nm to 1,000 nm. At least one opening is formed by patterning the alternating stack of insulating layers 240 and the electrically conductive layers 220. The shape of an opening may be in the shape of a line trench, in which case the remaining portions of the alternating stack of insulating layers 240 and electrically conductive layers 220 can be in the shape of strips that laterally extend along a common horizontal direction, and laterally spaced apart among one another along another horizontal direction. Alternatively, the shape of the opening may be circular or elliptical, in which case the remaining portions of the alternating stack of insulating layers 240 and electrically conductive layers 220 can have an annular shape with a cavity having a circular or elliptical horizontal cross-sectional shape therethrough.

A sidewall of each electrically conductive layer 220 (i.e., the first electrodes, such as word lines of a ReRAM device) is physically exposed in the opening. Each of the remaining portions of the electrically conductive layers 240 constitutes a first electrode. Thus, a plurality of first electrodes can be provided. The liquid dispersion 250 of any of the previous embodiments can be formed in the opening and directly on the sidewall of the first electrodes. In other words, the processing steps of the previous embodiments can be performed to form a variable resistance region 50 within the opening. An insulating cap layer 290 can be formed over the variable resistance region 50. A second electrode 280 (e.g., a local vertical bit line) can be formed through the variable resistance region 50, for example, at a center portion of the opening. A contact structure (e.g., a global bit line) 282 can be optionally formed on the top surface of the second electrode 280. Alternatively, the contact structure (e.g., global bit line) 282 may be located between the alternating stack and the substrate 210, and each of the second electrodes (e.g., local vertical bit lines) 280 may extend upwards from the contact structure 282 into the alternating stack.

The nanoparticle assemblies of the present disclosure can be employed to form a three-dimensional resistive memory cell employing the methods of the tenth embodiment. Nanoparticles embedded in a matrix (53, 156, 356) or not embedded in a matrix can be used to fill deep trenches of a three-dimensional memory device. Any of the materials and/or configurations of the previous embodiments can be employed.

Examples of the atomic layer deposition infiltration process that can be employed in various embodiments of the present disclosure are described herein. As discussed above, the atomic layer deposition infiltration process can be employed to induce infiltration of a precursor material into materials of a film derived from the liquid dispersion 250 such that the precursor material forms the matrix upon reaction with, or substitution of, a material in the ligand-grafted nanoparticles, such as by a ligand exchange process.

In a non-limiting illustrative example, nanoparticles (51, 52) can be synthesized with tethered short ligand molecules (e.g. functionalized alkyl chains) that act as stabilizers for the nanoparticles in liquid dispersions. In another illustrative example, the ligands may be exchanged and replaced by longer polymeric ligands that may facilitate processing or add functionality or make it easier for the nanoparticles to blend in polymeric composites. Alternatively, the original short ligands may be exchanged for inorganic ligands to tune the optoelectronic properties of the nanoparticles.

FIGS. 14A-14E illustrate an exemplary sequence of processing steps that can be employed to form any of the third through twelfth exemplary structures of the present disclosure. Nanoparticles (51, 52) with suitable ligands 51 are prepared as illustrated in FIG. 14A.

As shown in FIG. 14B, a liquid dispersion 250 is prepared, and is applied on a surface of at least one first electrode 20 by spin-coating, dip-coating, drop-casting, inkjet printing, or spraying. Liquid interfaces such as Langmuir-Blodgett films may also be employed to apply the liquid dispersion 250. The liquid dispersion 250 including the ligand-grafted nanoparticles (51, 52) may be deposited into openings, cavities, or wells, or as a thin film as described above. While FIG. 14B illustrates a configuration in which the liquid dispersion 250 is applied as a thin film, any other geometry that can support initial formation of a matrix 53 can be employed. The applied liquid dispersion 250 is optionally converted into a matrix 53, for example, by polymerization of the ligands 51. Optionally, the matrix 53 may be annealed at an elevated temperature, or may be otherwise cured (for example, by exposure to ultraviolet irradiation and/or by evaporation of solvents).

Referring to FIG. 14C, the in-process resistive memory cell can be introduced into an atomic layer deposition (ALD) process chamber, and can be exposed to a chemical vapor precursor material 155.

Referring to FIG. 14D, the matrix material of the modified matrix 156 is synthesized by the interaction of the precursor material 155 and a material within the initial matrix 53 or within the nanoparticles 52. The ligands 51 may be specifically designed to be inert to the precursor material 155, or to react with the precursor material 155, or to detach from the nanoparticles 52 to be substituted by the precursor material 155 that coats the surfaces of the nanoparticles 52.

In one embodiment, a modified matrix material can be grown by ALD by using a ligand 51 that binds to one of the ALD precursor materials 155. In this case, the modified matrix material of the modified matrix 156 grows over the network of ligand chains derived from the ligands 51. This process may be achieved for example, if the ligand 51 is polymethyl methacrylate (PMMA) and the precursor material 155 is trimethyl aluminum (TMA), which is used for synthesis of aluminum oxide. In this example, TMA selectively binds to the carbonyl groups of PMMA. After the modified matrix material is grown to form the modified matrix 156 using several cycles of ALD synthesis, the unreacted ligands 51 may be optionally removed by a suitable method (such as thermal decomposition, photodecomposition, reactive ion etch, wet etch, etc). A variable resistance region 50 of a BMC is formed in which the aluminum oxide barrier surrounds the titanium oxide nanoparticles. Referring to FIG. 14E, a second electrode 80 can be deposited on top of the variable resistance region 50.

In one embodiment, a core-shell nanoparticle of FIG. 11 may be employed in lieu of the nanoparticles described above. A core-shell nanoparticle includes a nanoparticle core and a nanoparticle shell that surrounds the nanoparticle core. The nanoparticle shell can be synthesized around the nanoparticle core during the chemical synthesis of a core-shell nanoparticle. The ligands 51 can be attached to the nanoparticle shell. In one embodiment, the processing steps FIGS. 14B-14E can be employed to form a variable resistance region 50.

Alternatively, a new shell material can be formed employing atomic layer deposition after formation of an initial ligands 51 or matrix 53 employing the methods illustrated in FIGS. 15A-15F. Referring to FIG. 15A, a film of ligand-grafted nanoparticles (51, 52) is deposited on a first electrode 20 over a substrate 10. Each of the ligand-grafted nanoparticles (51, 52) includes a nanoparticle 52 and a ligand 51 attached to the nanoparticle 52. The ligand 51, polymeric or otherwise, is chosen such that the ligand 51 is inert to the ALD precursors used to grow the shell material.

Referring to FIG. 15B, the initial matrix 53 (e.g., ligands 51 attached to nanoparticles 51) is exposed to a first ALD precursor material 255, which interacts with an outer portion of each nanoparticle 52. The first ALD precursor material 255 is selected are such that the first ALD precursor material 255 does not react with the material of the ligands 51 (which comprise the initial matrix 53 at this processing step), but reacts with the material of the nanoparticles 52 to form nanoparticle shells 57 as illustrated in FIG. 15C. The number of cycles of the ALD infiltration process and the size of the nanoparticles 52 are selected such that an inner portion of each nanoparticle 52 remains unchanged, while an outer portion of each nanoparticle 52 is converted into a nanoparticle shell 57.

Referring to FIG. 15D, the initial matrix 53 is exposed to a second ALD precursor material 155. The matrix material of the modified matrix 156 is grown in the spaces between the remaining nanoparticles 52 as illustrated in FIG. 15E. Unreacted portions of the ligands 51 can be optionally removed, for example, by thermal decomposition, photodecomposition, or an etch process (which may include a dry etch process or a wet etch process). A variable resistance region 50 of a BMC is thereby formed in which the inorganic modified matrix 156 forms the barrier material around the metal oxide nanoparticles 52. A second electrode 80 can be formed on the variable resistance region 50.

The various embodiments of the present disclosure provide barrier modulated cell comprising: a first electrode (20, 220) comprising a conductive material and located on a substrate (10, 210); a variable resistance region 50 including metal oxide nanoparticles (52, 62, 72) and a barrier material (76, 156, 356) in contact with the metal oxide nanoparticles, and a second electrode (80, 280.).

The barrier material can be selected from amorphous silicon, germanium, silicon oxide, tantalum oxide, and aluminum oxide, and the metal oxide nanoparticles comprise titanium oxide, hafnium oxide, zinc oxide, vanadium oxide, niobium oxide, tantalum oxide, strontium titanate or tin oxide.

In one embodiment, the barrier material comprises an inorganic matrix (156, 356) embedding the metal oxide nanoparticles. In another embodiment, the barrier material comprises inorganic shells 76 surrounding the nanoparticles (e.g., the nanoparticle cores 74).

Additional embodiments of the present disclosure provide a projected memory cell, comprising a first electrode (20, 220), a second electrode (80, 280), and a variable resistance region 50 located between the first and the second electrodes. The variable resistance region comprising chalcogenide phase change memory material nanoparticles (52, 62, 72) and a projection material liner (254, 256) that connects the first electrode to the second electrode. The projection material liner has a resistivity which is between low and high resistance states of the chalcogenide phase change memory material.

In one embodiment, the variable resistance region 50 is located in an opening 39 in an insulating layer 40 located between the first and the second electrodes. The projection material liner surrounds the chalcogenide phase change memory material nanoparticles in the opening.

Most commonly, the interface(s) responsible for the switching mechanism in a prior art ReRAM cell can be engineered in a two-dimensional fashion such that the interface(s) is/are parallel to an electrode or electrodes. This configuration limits the ratio of the active interface(s) to the total footprint of the memory cell (i.e., the area of the memory cell in a plan view along a direction perpendicular to a top surface of a substrate on which the memory cell is formed). The prior art interface or interfaces are commonly formed by stacking thin films on top of each other, which constrains the design of the interface to a single-type of interface across the device. Thus, it is not possible to change the material or materials along the interface. The various structures of the present disclosure provide resistance-switching interfaces that are not limited by contact areas between two intersecting conductive structures such as bit lines and word lines. As such, the various structures of the present disclosure can be employed to form high density resistive memory devices such as a three-dimensional array of resistive memory devices.

Although the foregoing refers to particular embodiments, it will be understood that the disclosure is not so limited. It will occur to those of ordinary skill in the art that various modifications may be made to the disclosed embodiments and that such modifications are intended to be within the scope of the disclosure. Where an embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A method of fabricating a memory cell, comprising:
forming a first electrode over a substrate;
providing polymer-grafted memory material nanoparticles by dispensing a liquid dispersion including polymeric ligand-grafted nanoparticles on the first electrode, wherein the polymer-grafted memory material nanoparticles form a polymer matrix made of the polymeric ligand that embeds the memory material nanoparticles, wherein the polymer matrix is located over the first electrode; and
forming a second electrode over the polymer matrix,
wherein the memory cell comprises a resistive memory cell and the memory material nanoparticles comprise resistive memory nanoparticles; and
wherein the method comprises at least one additional processing step selected from:
a first additional processing step of removing the polymer matrix from the memory material nanoparticles before forming the second electrode; or
a second additional processing step of providing additional nanoparticles having a different composition than the nanoparticles of the polymeric ligand-grafted nanoparticle.

2. The method of claim 1, wherein the method comprises the first additional processing step.

3. The method of claim 2, wherein:
removing the polymer matrix comprises removing the polymeric ligands by thermal decomposition, plasma treatment or exposure to a solvent or acid vapor that detaches the polymeric ligands from the nanoparticles;
at least 50% of all nanoparticles contact another nanoparticle after removal of the polymeric ligands; and
a continuous path consisting essentially of a subset of the nanoparticles is formed between the first electrode and the second electrode after removal of the polymeric ligands.

4. The method of claim 3, further comprising sintering the nanoparticles together after the nanoparticles collapse after removing the polymeric ligands.

5. The method of claim 2, wherein removing the polymer matrix from the memory material nanoparticles comprises replacing the polymer matrix with an inorganic matrix using an atomic layer deposition infiltration process to induce infiltration of a precursor material into materials of the liquid dispersion, wherein the precursor material forms the matrix upon reaction with, or substitution of, a material of the polymeric ligand-grafted nanoparticles.

6. The method of claim 5, wherein:
the nanoparticles comprise chalcogenide phase change memory material nanoparticles;
the inorganic matrix forms a projection material liner that connects the first electrode to the second electrode;
the projection material liner has a resistivity which is between low and high resistance states of the chalcogenide phase change memory material; and
the resistive memory cell comprises a projected memory cell.

7. The method of claim 5, wherein:
the nanoparticles comprise metal oxide nanoparticles;
the inorganic matrix forms a barrier material for the metal oxide nanoparticles; and
the resistive memory cell comprises a barrier modulated cell.

8. The method of claim 1, further comprising using an atomic layer deposition infiltration process to form an inorganic shell around each of the nanoparticles located in the polymer matrix.

9. The method of claim 8, wherein:
the nanoparticles comprise metal oxide nanoparticles;
the inorganic shell forms a barrier material for the metal oxide nanoparticles; and
the resistive memory cell comprises a barrier modulated cell.

10. The method of claim 1, wherein:
the nanoparticles comprise metal oxide nanoparticle cores surrounded by an inorganic barrier material shell; and
the resistive memory cell comprises a barrier modulated cell.

11. The method of claim 1, wherein the method comprises the second additional processing step.

12. The method of claim 11, wherein superlattices of two or more types of nanoparticles are located in the memory cell.

13. A method of fabricating a memory cell, comprising:
forming a first electrode over a substrate;
providing polymer-grafted memory material nanoparticles by dispensing a liquid dispersion including polymeric ligand-grafted nanoparticles on the first electrode, wherein the polymer-grafted memory material nanoparticles form a polymer matrix made of the polymeric ligand that embeds the memory material nanoparticles, wherein the polymer matrix is located over the first electrode; and
forming a second electrode over the polymer matrix,
wherein the memory cell comprises a resistive memory cell and the memory material nanoparticles comprise resistive memory nanoparticles; and
wherein the method comprises at least one feature selected from:
a first feature that the nanoparticles are embedded in the polymer matrix after forming the second electrode; or
a second feature that the first electrode is formed as a planar layer, the liquid dispersion is dispersed on a top surface of the first electrode, a thickness of the liquid dispersion is less than twice a maximum dimension of the ligand-grafted nanoparticles, and the second electrode is formed on the variable resistance region.

14. The method of claim 13, wherein the method comprises the first feature.

15. The method of claim 13, wherein the method comprises the second feature.

16. The method of claim 13, further comprising using an atomic layer deposition infiltration process to form an inorganic shell around each of the nanoparticles located in the polymer matrix.

17. The method of claim 16, wherein:
the nanoparticles comprise metal oxide nanoparticles;
the inorganic shell forms a barrier material for the metal oxide nanoparticles; and
the resistive memory cell comprises a barrier modulated cell.

18. The method of claim 13, wherein:
the nanoparticles comprise metal oxide nanoparticle cores surrounded by an inorganic barrier material shell; and
the resistive memory cell comprises a barrier modulated cell.

19. A method of fabricating a memory cell, comprising:
forming a first electrode over a substrate;
providing polymer-grafted memory material nanoparticles by dispensing a liquid dispersion including polymeric ligand-grafted nanoparticles on the first electrode, wherein the polymer-grafted memory material nanoparticles form a polymer matrix made of the polymeric ligand that embeds the memory material nanoparticles, wherein the polymer matrix is located over the first electrode; and
forming a second electrode over the polymer matrix,
wherein the memory cell comprises a resistive memory cell and the memory material nanoparticles comprise resistive memory nanoparticles; and
wherein the method comprises at least one additional set of processing steps selected from:
a first set of processing steps comprising:
forming an insulating layer over a top surface of the first electrode, and
forming an opening extending through the insulating layer, wherein a top surface of the first electrode is physically exposed at a bottom of the opening, the liquid dispersion is dispensed in the opening, and the second electrode is formed on a top surface of the insulating layer; or
a second set of processing steps comprising:
forming an alternating stack of insulating layers and electrically conductive layers over the substrate, wherein the first electrode is one of the electrically conductive layers, and
forming an opening extending through the alternating stack, wherein a sidewall of the first electrode is physically exposed in the opening, the liquid dispersion is dispensed in the opening and directly on the sidewall of the first electrode, and the second electrode is formed through the variable resistance region at a center portion of the opening.

20. The method of claim 19, wherein the method comprises the first set of processing steps.

21. The method of claim 20, wherein the opening includes a constriction zone having a horizontal cross-sectional area that is less than a horizontal cross-sectional area of a top periphery of the opening and is less than a horizontal cross-sectional area of a bottom periphery of the opening.

22. The method of claim 19, wherein the method comprises the second set of processing steps.

23. The method of claim 19, further comprising using an atomic layer deposition infiltration process to form an inorganic shell around each of the nanoparticles located in the polymer matrix.

24. The method of claim 23, wherein:

the nanoparticles comprise metal oxide nanoparticles;

the inorganic shell forms a barrier material for the metal oxide nanoparticles; and the resistive memory cell comprises a barrier modulated cell.

25. The method of claim 19, wherein:

the nanoparticles comprise metal oxide nanoparticle cores surrounded by an inorganic barrier material shell; and the resistive memory cell comprises a barrier modulated cell.

* * * * *